US006761770B2

(12) United States Patent
Bartholomew et al.

(10) Patent No.: US 6,761,770 B2
(45) Date of Patent: Jul. 13, 2004

(54) ATMOSPHERIC PRESSURE WAFER PROCESSING REACTOR HAVING AN INTERNAL PRESSURE CONTROL SYSTEM AND METHOD

(75) Inventors: Lawrence D. Bartholomew, Felton, CA (US); Robert J. Bailey, Santa Cruz, CA (US); Seung G. Park, Felton, CA (US); Soon K. Yuh, Scotts Valley, CA (US)

(73) Assignee: Aviza Technology Inc., Scotts Valley, CA (US)

( * ) Notice: Subject to any disclaimer, the term of this patent is extended or adjusted under 35 U.S.C. 154(b) by 133 days.

(21) Appl. No.: 10/226,773

(22) Filed: Aug. 23, 2002

(65) Prior Publication Data

US 2003/0094136 A1 May 22, 2003

Related U.S. Application Data

(60) Provisional application No. 60/314,760, filed on Aug. 24, 2001.

(51) Int. Cl.[7] .............................................. C23C 16/00
(52) U.S. Cl. ........................ 118/708; 118/663; 118/710; 118/712; 118/715; 427/248.1
(58) Field of Search ................... 118/663, 708, 118/710, 712, 715, 696; 156/345.29; 427/248.1

(56) References Cited

U.S. PATENT DOCUMENTS

| 5,113,789 A | | 5/1992 | Kamian ....................... 118/715 |
|---|---|---|---|
| 5,118,286 A | | 6/1992 | Sarin ............................... 432/2 |
| 5,683,516 A | | 11/1997 | DeDontney et al. ......... 118/718 |
| 5,849,088 A | * | 12/1998 | DeDontney et al. ......... 118/719 |
| 5,851,293 A | | 12/1998 | Lane et al. ................... 118/715 |
| 5,888,579 A | * | 3/1999 | Lun ............................... 427/8 |
| 6,143,080 A | * | 11/2000 | Bartholomew et al. ...... 118/718 |
| 6,187,092 B1 | * | 2/2001 | Wollesen ...................... 117/202 |
| 6,228,170 B1 | * | 5/2001 | Chen et al. .................. 118/663 |
| 2002/0180449 A1 | * | 12/2002 | Ushiku et al. ............... 324/464 |
| 2003/0094136 A1 | | 5/2003 | Bartholomew et al. ...... 118/715 |

* cited by examiner

*Primary Examiner*—Jeffrie R. Lund
(74) *Attorney, Agent, or Firm*—Dorsey & Whitney LLP

(57) ABSTRACT

An atmospheric pressure wafer processing system for delivering at least one gas is provided, having an exhaust control feedback system that utilizes sensors to measure the pressure within the system and adjusts control units to maintain the desired set pressures within the system. In particular the sensors measure the small differential pressures inside a muffle, and specifically the load, bypass center and unload sections of the muffle, relative to the chase ambient pressure. Controlling the muffle pressures directly within the atmospheric system yields a more stable pressure balance for processing wafers less subject to changes in the external environment and allows for compensation of varying input gas flows as occurs when the supply pressure to the system may vary. This system and method of pressure control is particularly advantageous for chemical vapor deposition application yielding improved process repeatability over an extended period of runtime.

32 Claims, 13 Drawing Sheets

ATMOSPHERIC PRESSURE WAFER PROCESSING REACTOR HAVING AN INTERNAL PRESSURE CONTROL SYSTEM AND METHOD

RELATED APPLICATIONS

This application claims the benefit of U.S. Provisional Application Serial No. 60/314,760, filed on Aug. 24, 2001, the disclosure of which is hereby incorporated by reference in its entirety.

FIELD OF THE INVENTION

The present invention relates generally to the field of wafer processing reactors or systems and methods used in the manufacture of semiconductors and integrated circuits. More specifically, the invention relates to an atmospheric pressure wafer processing reactor having an internal pressure control system and method.

BACKGROUND OF THE INVENTION

Wafer processing reactor systems and methods are widely used in the manufacture of semiconductors and integrated circuits. One particular type of wafer processing system utilizes chemical vapor deposition (CVD) to deposit films or layers on the surface of a substrate as a step in the manufacture of semiconductors and integrated circuits. A variety of different CVD systems are used in the art. For example, films may be deposited using low pressure CVD (LPCVD) systems, atmospheric pressure CVD (APCVD) systems or different types of plasma enhanced CVD (PECVD) systems. In general principle, all such systems employ a deposition chamber where certain injected gaseous chemicals react and deposit a layer of material on the surface of the substrate. Many types of materials may be deposited, with dielectrics such as oxides and doped oxides being a typical example.

For proper operation of the system, and in particular to deposit a film of desired quality and repeatability, the flow of the gases within the reactor is important. Specifically, it is desirable to achieve a substantially uniform flow of gases in the area proximate the surface of the substrate so that certain concentrations of the gaseous chemicals or reactants are available at the surface of the substrate to deposit a proper film. Moreover, control of the flow of such gases promotes more efficient utilization of the gases for reaction.

Another important criterion when depositing films is the thickness uniformity of the film. It is desirable to achieve a film of substantially uniform thickness over the entire surface of the substrate. This aspect becomes even more important as the diameter of substrates continues to increase. The flow of the reactive gases within the chamber plays an important role in the resulting film thickness. Thus, it is desirable to control the flow rate of the gases and to promote substantially uniform flow of the reactive gases over the entire surface of the substrate.

A further important criterion in wafer processing systems is minimization of particles and contaminants formed in the reactor. Particles and contaminants are caused mainly by the accumulation of unreacted and by-product gaseous chemicals and the formation of deposits (often called powder build-up) on interior reactor surfaces. These deposits are a substantial source of particles that may contaminate the films deposited on the substrate. To remove the deposits the system must be taken offline and serviced. Contaminants and gaseous chemicals that accumulate in stagnant flow regions promote corrosion of the reactor and can severely reduce system longevity, as well as contribute to the contamination problem. The flow of inert and reactive gases plays an important role in either promoting or minimizing the accumulation of unreacted and by-product gaseous chemicals, and thus determines, in part, the extent of the powder build-up. It is therefore desirable to provide a system that promotes control of the inert and reactive gas flows to minimize accumulation and powder build-up.

It has been found that the control of the exhaust flow rate of the various gases may be used to address the aforementioned concerns. Problems may arise when the exhaust system of a reactor does not function properly. For example, if the exhaust flow rate is too high, reactive gases do not completely react and deposition on the surface of the substrate is hampered. Conversely, if the exhaust flow rate is too slow, the gas flows are undefined, leading to increased accumulation in the chamber that may cause deposits to form on the chamber walls. Accordingly, it is desirable to provide a system and method that controls, or "meters," the exhaust flow of gases by achieving and maintaining certain selected gas flow rate values within the system. Additionally, since powder build up does occur and may lead to changes in flow conditions over time, it is desirable to provide a system and method which employs control means which accurately control the gas flows and do not deteriorate over time.

One prior art approach that has addressed these issues is described in U.S. Pat. No. 6,143,080, the disclosure of which is hereby incorporated by reference. In general the '080 patent provides a wafer processing system for delivering a processing gas and an inert gas to a chamber that includes a CVD processing region having a plurality of gas flow paths for conveying the gases to the chamber and exhausting them from the chamber. The active exhaust of the bypass plenums allows excess chamber gases to be extracted from the system without asymmetric gas flow conditions surrounding different chambers. Placement of the load and unload exhausts internal to the system and between inert gas curtains allows the exhaust flow control system to actively maintain a desired pressure differential (near zero) across the chambers in an open APCVD system exposed to changing external environmental conditions. The system exhaust flow control system merges load and unload gas paths and the bypass exhaust gas flow path into the chamber exhaust gas flow path.

In this exemplary prior art system and method, a flow control system is coupled to each of several exhaust gas flow paths. Each of the process gas exhaust flow paths are separately controlled to maintain a constant rate of flow within each of the gas flow paths independent of the accumulation of deposition byproducts. A self-cleaning orifice is utilized to facilitate a pressure differential measurement in the process exhaust line to measure flow. The wafer processing system is provided with load and unload regions surrounding the chamber(s), each having additional inert gas exhaust flow paths. While this prior art system and method of gas flow control has provided advances in the field, additional improvements are desirable. For example, in-the prior art system, the self-cleaning orifice is subject to glass and powder accumulation that distorts the assumed correlation between exhaust gas mass flow and pressure difference across the orifice over time. Thus, the total exhaust gas mass flow may change over time, causing an undesirable shift in the deposited oxide film thickness and variation in process results from one wafer to the next. For $SiO_2$ film applications, the process exhaust typically drops as the orifice accumulates glass and powder over time and the deposited film thickness increases. Additionally, due to the requirement for self-cleaning of the orifice, mechanisms to rotate the toroid and the spring that wipes the orifice surface allow leakage in the exhaust line. Because the resultant seal is less than optimal, thorough leak-checking of the facility exhaust line is inhibited. Furthermore, leaks may shift the assumed correlation of exhaust gas mass flow and pressure difference across the orifice. Thus, after preventive maintenance disassembly and cleaning of the exhaust line components, the setpoint for the pressure difference across the orifice must be modified frequently to achieve the same process condition. Maintaining the same setpoints on the system is desirable for production operation without extra engineering support.

Finally, controlling the total exhaust mass flow to be constant in an open Atmospheric Pressure CVD system does not compensate for input gas flow changes, nor does it maintain a stable pressure balance in the system when the external conditions change. Variations in input gas flow through rotameters occur when facility gas supply pressures change, as can happen when gas flows in adjacent non-continuous processing systems are turned on or off. Also, when operators open or close the portal doors to access wafer cassettes for loading or unloading, the load end of the system is exposed to the clean room pressure which may be substantially above the chase side pressure surrounding the system. Wafer loading of the system also affects the internal pressure balance, particularly since very small pressure variations can perturb the gas flows and deposited film results inside an open APCVD system. Accordingly, it is desirable to provide further improvements in atmospheric pressure wafer processing systems.

SUMMARY OF THE INVENTION

It is an object of the present invention to provide an improved wafer processing system, and more particularly an improved atmospheric pressure chemical vapor deposition (APCVD) system. Another object of the present invention is to provide a system and method that minimizes accumulation of gases and the formation of unwanted deposits within the system. A further object of the present invention is to provide a system and method that promotes the deposition of substantially uniform films on the surface of substrates.

In one embodiment, these and other objects of the invention are achieved by an atmospheric pressure wafer processing system for delivering at least one gas, having an exhaust control feedback system that utilizes sensitive sensors to measure the differential pressure within the system relative to the chase ambient pressure and adjusts control units to maintain the selected preset pressures within the system. In particular, the sensors measure the pressures inside a muffle, and specifically the load, bypass center and unload sections of the muffle, relative to the chase ambient pressure. Controlling the muffle pressures directly within the atmospheric system yields a more stable pressure balance for processing wafers less subject to changes in the external environment and allows for compensation of varying input gas flows as occurs when the supply pressure to the system may vary.

In another embodiment of the present invention, a chemical vapor deposition processing system is provided for delivering one or more reactive gases and one or more inert gases to process a wafer or other substrate. The system comprises a muffle. a load region through which wafers are inserted into the muffle, an unload region through which wafers are removed from the muffle, and a process chamber exhaust flow path through which reactive gases and some inert gases removed from the muffle are exhausted. The muffle is maintained at approximately atmospheric pressure and contains at least one process chamber that houses at least one injector through which one or more reactive gases are injected and at least one shield or curtain through which one or more inert gases are injected into a deposition region and at least one exhaust vent through which reactive gases and inert gases are removed. At least a first pressure transducer is provided for measuring the pressure difference between the muffle in the process chamber region and the ambient atmospheric pressure and providing a feedback control signal in response to the pressure difference. A first control unit comprising a first throttle valve that is controllable in response to the feedback control signal meters the flow of gases that are exhausted from the process chamber exhaust flow path of the CVD system.

In another embodiment of the present invention, a method of delivering and exhausting a gas to a process chamber in an atmospheric pressure reactor is provided. In general, the method comprises the steps of establishing at least one gas flow path within the reactor. The gas is conveyed through a gas flow path and the differential pressure between the process chamber or one or more sections of the gas flow path surrounding the process chamber and the ambient atmosphere outside the system is measured. A flow control unit, responsive to the measured differential pressure or pressures, is selectively adjusted to control a flow rate of the gas to maintain the differential pressure substantially equal to a preset, constant value. Additionally, the gas may travel through a plurality of gas flow paths, and the flow rates of the gases are separately controlled to maintain selected differential pressures within each of the measured areas. Further, additional gas flow rates may be maintained at a substantially constant value within each of the gas flow paths to promote uniform delivery and exhaust of the gases, even if the gas temperature or geometry of the path changes over time.

BRIEF DESCRIPTION OF THE DRAWINGS

Other objects and advantages of the present invention will become apparent upon reading the detailed description of the invention and the appended claims provided below, and upon reference to the drawings, in which:

DETAILED DESCRIPTION OF THE INVENTION

The present invention is directed to an atmospheric pressure wafer processing reactor having an internal pressure control system and method. Generally, a wafer processing system is provided for delivering at least one gas. The wafer processing system has an exhaust control feedback system that utilizes sensors to measure the pressure within the system and adjusts control units to maintain the desired set pressures within the system. More specifically, the system and method of the present invention provides sensors that measure the pressures inside various regions of an atmospheric pressure CVD (APCVD) system, in one example specifically the load, bypass center, and unload sections of the muffle of the APCVD system (relative to the chase ambient pressure). The system and method adjust pressure control units as necessary to maintain the desired set pressures within the process chambers and on the load and unload sides of the chambers. Direct control of the muffle pressures directly provides a more stable pressure balance for processing wafers less subject to changes in the external environment and allows for compensation of varying input gas flows as occurs when the supply pressure to the rotameters varies.

Figure 1:
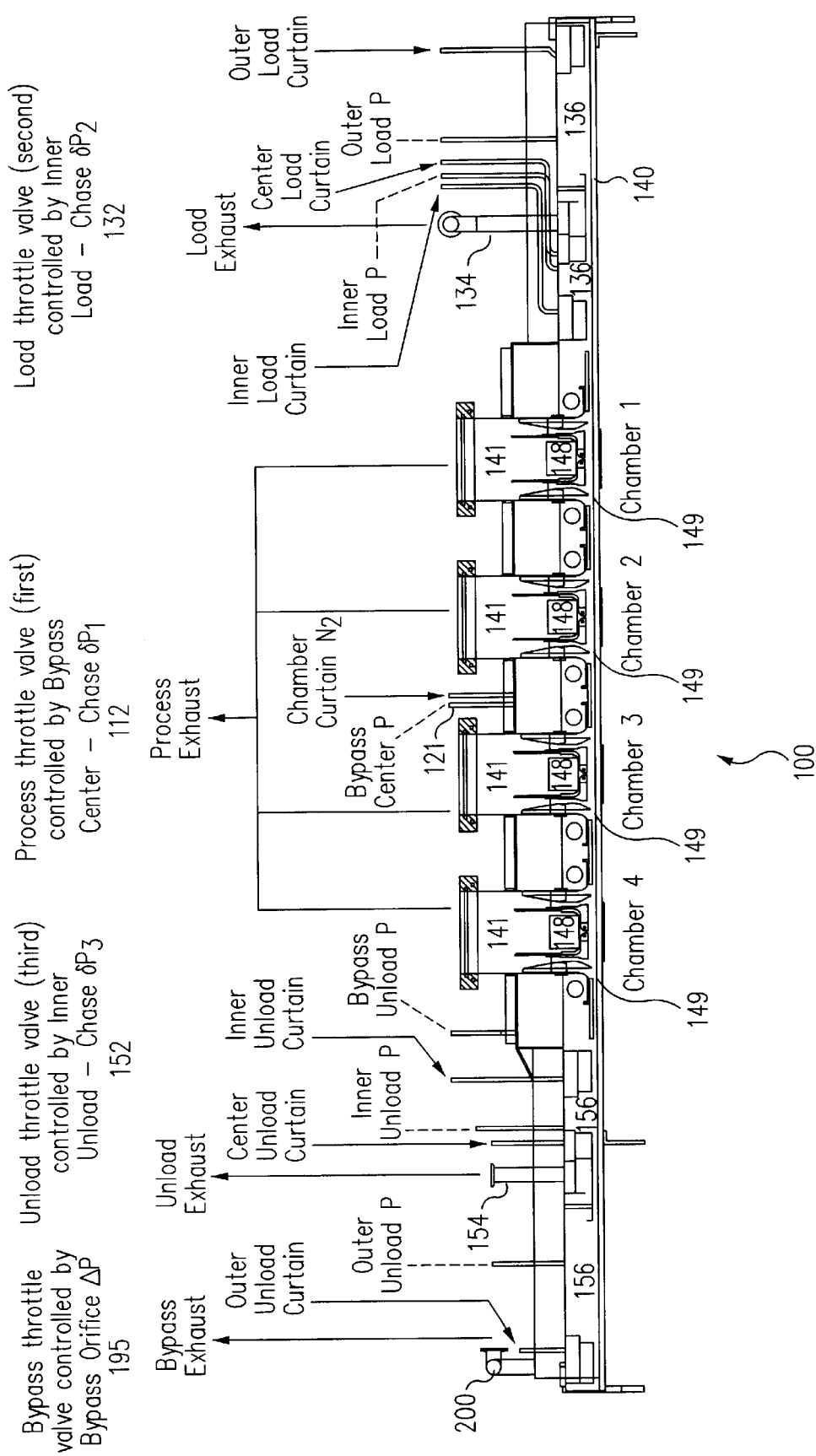
FIG. 1 is a cross-sectional view of a wafer processing system according to one embodiment of the present invention.

One embodiment of the system of the present invention is illustrated in FIG. 1. The system generally includes an atmospheric pressure chemical vapor deposition system 100. In general, the CVD reactor 100 includes a muffle 140, having load 136 and unload 156 regions positioned at opposite ends of the muffle 140. The muffle 140 includes at least one chamber 141 having an injector 148 and protective shield assembly 149 positioned therein for depositing one or more reactive gases or products on a substrate. A conveyorized transport means (not shown) extends through the muffle 140 for conveying substrates through the muffle. The reactor chamber, including the muffle 140 and injector and protective shield assemblies are described in greater detail in U.S. Pat. Nos. 5,683,516; 5,849,088; and 6,143,080 the entire descriptions of which are expressly incorporated herein by reference. The load region 136 is placed at one end of the muffle 140, and at the opposite end of the muffle is the unload region 156. To deposit films on the surface of a wafer, the load region 136 is configured to receive wafers or semiconductor circuits for processing. Typically, an automatic load mechanism (not shown) is employed to place the wafers into the load region 136 of the muffle 140. Wafers are conveyed through the muffle 140 by the transport means. The wafers pass through the muffle 140 and one or more deposition chambers 141 contained therein where the wafers are processed. The wafers then exit the muffle 140 through the unload region 156.

Figure 2:
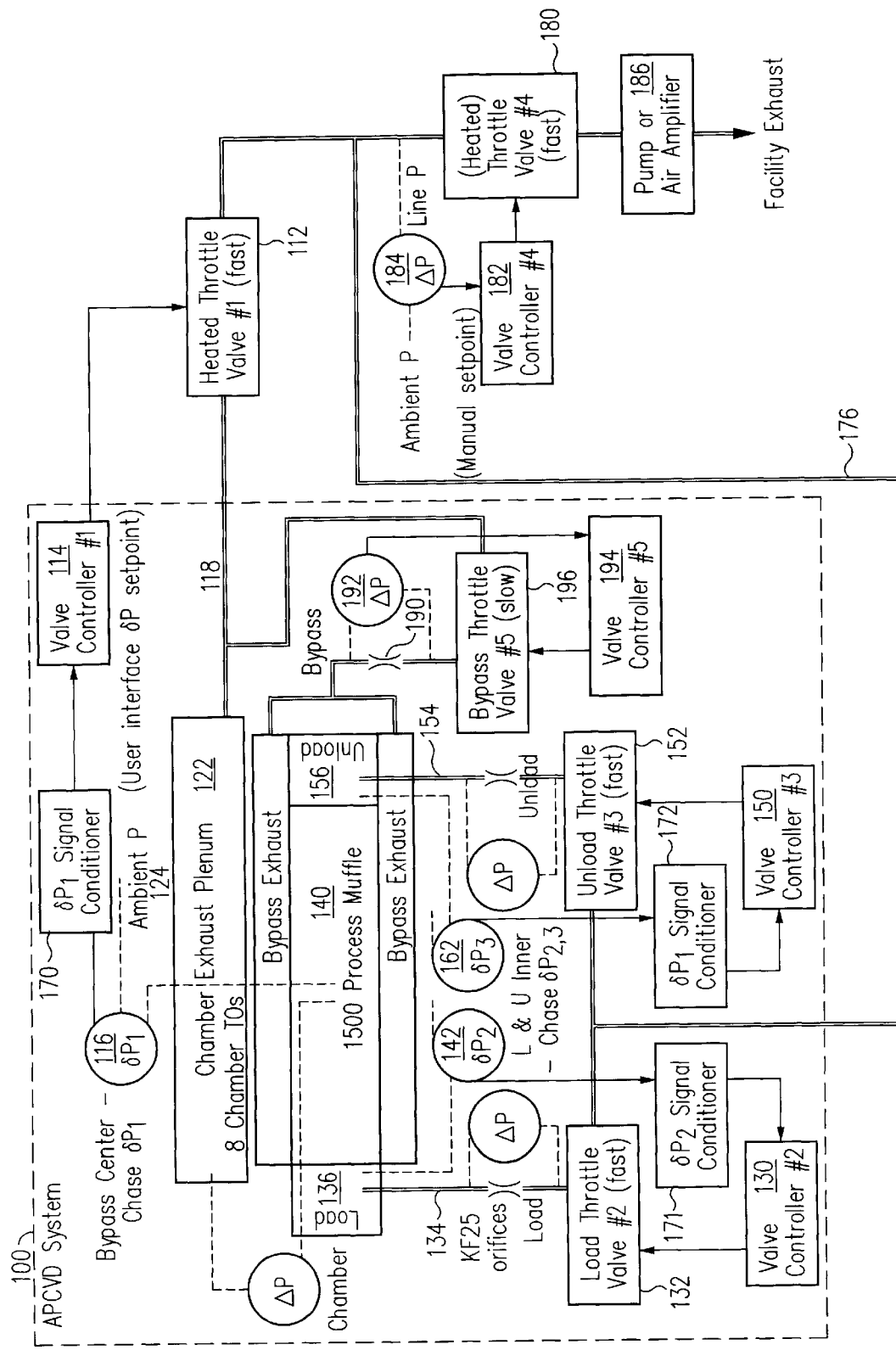
FIG. 2 is a schematic diagram of a wafer processing system showing the exhaust control system according to one embodiment of the present invention.

One embodiment of the present invention as shown in FIG. 2 provides an exhaust control feedback system including pressure transducers 116, 142, 162 that provide feedback to valve controllers 114, 130, 150 that control throttle valves 112, 132, 152 on the main 118, load 134, and unload 154 exhaust lines. More specifically, as illustrated in FIG. 2, an atmospheric pressure chemical vapor deposition system 100 includes a first throttle valve 112 controlled via a dynamic feedback signal from a first valve controller 114 that receives input from a first pressure transducer 116 sensing the muffle differential pressure from the center position 121 of the bypass exhaust manifold 120 of the muffle 140 to the ambient chase room 124. The first throttle valve 112 preferably includes a fast motor to facilitate rapid flow rate adjustments and is heated to reduce powder and deposition byproduct accumulation within the valve. The first valve controller 114 provides dynamic feedback to the first throttle valve 112 to control the pressure inside the muffle 140 by regulating exhaust flow out of the exhaust plenum 122 via main exhaust line 118. A dynamic feedback control signal from a second valve controller 130 for a second throttle valve 132 (load throttle valve) in the load exhaust line 134 is provided to control the pressure inside the load 136 section of the muffle 140 in response to the differential pressure from the load inner position to the ambient chase room 124 as measured by a second pressure transducer 142. A dynamic feedback control signal from a third valve controller 150 for a third throttle valve 152 (unload throttle valve) in an unload exhaust line 154 is provided to control the pressure inside the unload 156 section of the muffle 140 in response to the differential pressure from the unload inner position 156 to the ambient chase room 124 as measured by a third pressure transducer 162. A fourth throttle valve 180 controlled by a fourth valve controller 182 regulates the facility exhaust line pressure provided to both the main exhaust line 118 and the load/unload exhaust line 176 based on feedback from a pressure transducer 184 measuring the differential pressure inside the exhaust line relative to the ambient chase room 124. A pump 186 is provided to evacuate the combined exhaust gases to the facility exhaust. The pump is preferably a high efficiency venturi flow air amplifier unit rather than a ring compressor blower unit or the facility's standard house line vacuum. An additional fifth flow control system controls the flow of gases within the bypass exhaust gas flow path 200. Inert gases exhausted from each side of the process chamber or chambers are conveyed through the two bypass vents 120 on each side of the reactor. Preferably, the gases exit at one end of each of the vents 120 and the two gas streams are combined. The pressure drop of the combined gas stream across an inline orifice 190 is measured by pressure transducer 192. The pressure measurement is sent to a fifth valve controller 194 that responsively adjusts a fifth throttle valve 196 (bypass exhaust throttle valve) to maintain a certain flow rate which is correlated to the pressure drop with compensation for temperature variation.

The present invention incorporates sophisticated pressure transducers having anti-vibration mountings and precise temperature controls to accurately measure small differential pressures on the order of about 0.02 Torr (about 0.01" $H_2O$ column) at an absolute pressure of approximately 1 atmosphere and to provide control signals to the throttle valves that command appropriate reactions to minimize the pressure variation. Such pressure transducers are available commercially from, for example MKS Instruments (Santa Clara, Calif.). The pressure control apparatus is substantially different in this APCVD application to control the pressure differential from an absolute level near 760 torr rather than to control the pressure to the order of 0.02 torr absolute as in prior art vacuum CVD systems. Controlling pressure to within an absolute error of less than approximately 0.001 torr and preferably with sensitivity to changes of approximately 0.0002 torr is substantially more difficult at an absolute pressure of approximately 1 atmosphere than under vacuum conditions for which an absolute deviation in the range of approximately 0.0002 torr to 0.001 torr is a much larger relative error and thus more easily measured and corrected if necessary.

Both the response time of the first 116, second 142, and third 162 pressure transducers, and the signal filter time are adjusted to provide feedback control signals to the throttle valve controllers 114, 130, 150. Transducer response or averaging times in the range of approximately 0.2 seconds to 3.5 seconds are preferred. Transducers provided by MKS Instruments meet the requirements laid out herein with respect to internal response times and dynamic ranges. Alternatively, any pressure transducer meeting the described specifications may also be used. The pressure transducers used in the system and method of the present invention are selected to have a dynamic range of approximately 0.1 torr or 0.05" $H_2O$. A response or averaging time of approximately 0.4 seconds and a range of approximately 0.1 torr is preferred for the first transducer 116, the second transducer 142, and the third transducer 162 for measuring the pressure differentials between the bypass center, load, and unload sections of the muffle and the ambient chase room 124. Appropriate Proportional-Integral-Derivative (PID) control settings for the valve controllers 114, 130, 150 are used such that the valves can respond to small shifts in differential pressure on the order of about 0.001 Torr (about 0.0005" $H_2O$ column) and more preferably on the order of approximately 0.0002 Torr (about 0.0001" $H_2O$ column) to maintain a desired set point while simultaneously minimizing the pressure variation of a similar order measured inside the APCVD system.

In a further preferred embodiment of the present invention, the pressure differential signal from the first pressure transducer 116 is passed to a signal conditioner 170 prior to being delivered to the first valve controller 114. The signal conditioner 170 filters data from pressure transducer 116 by averaging the data over a preset period of time. The signal conditioner averaging time is preferably within the range of approximately 1 to 10 seconds. As discussed in greater detail below, the inventors have found that a signal conditioner averaging time of approximately 3 seconds provides the best performance in a WJ-1500 APCVD system provided by ASML US, Inc. An additional embodiment of the present invention provides similar signal conditioners 171 and 172 to condition the data from the second and third pressure transducers 142 and 162 prior to their being delivered to the second (load) and third (unload) valve controllers 130 and 150, respectively.

Prior art APCVD systems and methods have not addressed the desirability of maintaining a selected pressure value within the process chamber by varying the process exhaust. Pressure control of a process chamber is used in vacuum systems, however the system and method of the present invention in atmospheric pressure wafer processing systems is substantially different and contrary to the prior art approach. The present invention provides for precise control of very small pressure differentials at approximately atmospheric absolute pressure in an open system instead of a closed sealed system such as, for instance a vacuum system. Specific tuning of pressure sensors and the control feedback signal to the throttle valve response provides a substantial improvement in pressure stability inside the system. The system of the present invention is capable of quickly adjusting to very small shifts in pressure such as occur when the portal doors open and when wafers pass through the muffle.

Contrary to prior art methods of process exhaust control that rely upon a pressure or flow measurement across an orifice or other instrument positioned inside the process chemical exhaust line that may become fouled with deposition by-products and powder over time, the present invention provides a system and method for collecting pressure measurements externally to the process chemical exhaust line that are therefore not subject to deposition by-products and powder clogging. Thus, in the system and method of the present invention, the process exhaust control is stable over longer production run times. Additionally, prior art systems have utilized a self-cleaning orifice such as those described in U.S Pat. No. 5,113,789, the disclosure of which is hereby incorporated by reference. While useful, self-cleaning orifices generally incorporate moving seals that are not leak tight or stable over time or from unit to unit. The system and method of the present invention allows for a substantially leak-tight facility process chemical exhaust line downstream of the system that provides the dual benefits of improved operational repeatability after system maintenance and simplified maintenance procedures. Adjustments to process recipe settings to obtain consistent process results on the wafer after maintenance are required in prior art system and methods. The system and method of the present invention avoids these difficulties.

A further advantage of the present invention is provided by the automatic compensation of the pressure control system in response to minor changes in input flow. The system and method of the present invention increases the process exhaust flow when more gas is injected into the process chambers and decreases the process exhaust flow when less gas is injected into the process chambers. Thus in the system and method of the present invention, fluctuations in facility gas supply pressure or variations in flow controllers, including changes in process or recipe settings are much less likely to cause under-exhausting of the process gas and potential loss of chemical containment in the open atmospheric pressure system. Due to the pressure control of the process chambers provided by the present invention, operational safety is increased and minor recipe changes to the process are less difficult.

Of particular advantage, the system and method of the present invention provide feedback sensors to measure the differential pressure inside the load and unload sections of the muffle (relative to the chase ambient pressure) and to adjust the control units to maintain a substantially zero pressure difference between the load and unload sides of the system (per set points). The procedure to obtain a desirable pressure balance is simplified by having direct recipe control of the pressure settings. This internal pressure balance is maintained even when wafers are loaded or unloaded or when external room pressure or flow changes occur. In another embodiment, the system may use varying curtain flows rather than exhaust flow to maintain the desired pressure balance, but again by using muffle pressure sensor feedback rather than a flow characteristic within the load and unload exhaust paths. In this alternative embodiment, flow of inert gases to the curtains is controlled by a flowmeter such as for example a commercially available mass flow controller. This method of pressure control may be employed in either or both the load and unload regions of the muffle.

Figure 3:
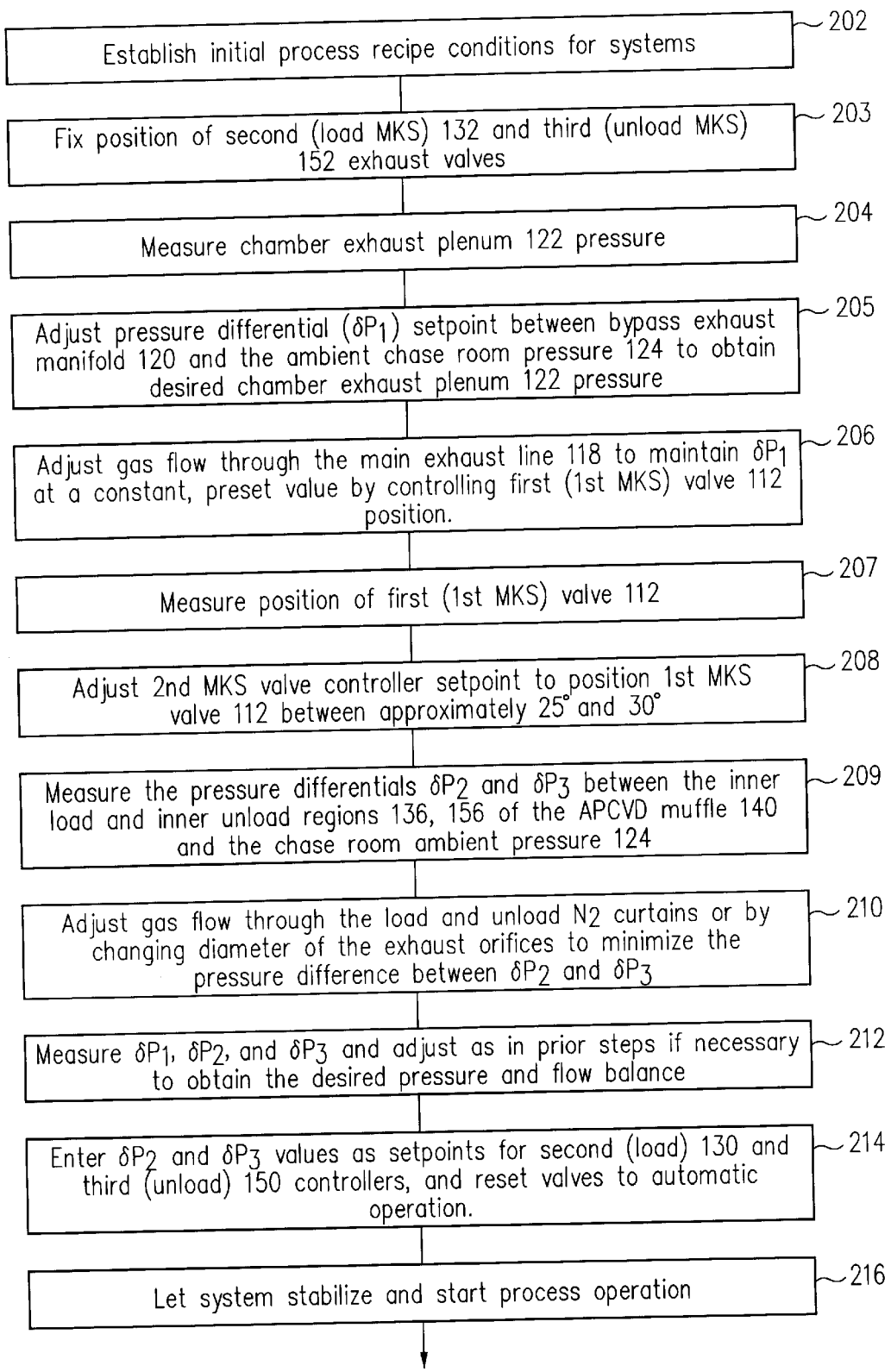
FIG. 3 is a flow chart that schematically illustrates one embodiment of the method of the present invention.

In one embodiment of the present invention a method is provided for balancing both the pressures and gas flows in an atmospheric pressure chemical vapor deposition system. One embodiment of the operational procedure is schematically illustrated by the flow chart shown in FIG. 3. First, the initial process recipe conditions for the reactor are established at step 202. The process conditions include the desired input gas flow rates for the various reactive and inert gases for the particular type of film to be deposited on the wafer surface. For example, the process conditions might include the input flow rates of gases from injector ports within the injectors 148 in the process chambers 141 within the muffle 140. These flow rate values will be selected based on achieving desirable uniformity of the gas flow about the wafer and delivery of reacting chemicals to the wafer. Flow rates of inert gases though shield bodies 149 within the chambers 141 may also be specified. Additionally, the flow rate of the chamber process exhaust may be selected for chemical containment and particle defect control. The bypass exhaust flow rate may be established, and the flow rates of gases in the load and unload regions of the muffle are selected. The system should be configured for deposition with the surrounding mini-environment and facility supply gas pressures set to their desired operating values.

Next, the second (unload) and third (unload) exhaust valves 132, 152 may be fixed at a desirable position, such as in one example approximately 30°, for operational control at step 203. At step 204, the chamber exhaust plenum 122 pressure is measured and compared to the recipe calculation for sufficient chamber process exhaust flow to maintain chemical containment for the specific initial recipe conditions selected. The setpoint for the pressure differential $\delta P_1$ 116 between the center of the bypass exhaust manifold 120 and the ambient chase room pressure 124 is then in step 205 adjusted lower to increase the process exhaust flow or higher to decrease the process exhaust flow to obtain the desired value for the chamber exhaust plenum 122 pressure. The typical operational setpoints for $\delta P_1$ range from approximately 0.0050" $H_2O$ to 0.0150" $H_2O$. This $\delta P_1$ setpoint change automatically opens or closes the first throttle valve 112 to adjust the gas flow through the main process exhaust line 118, as indicated in step 206.

Next, in step 207, the position of the first throttle valve 112 is measured. In step 208, the setpoint of the fourth valve controller 182 which controls the fourth throttle vale 180 is adjusted to change the facility line pressure measured by the fourth pressure transducer 184 so that the first throttle valve 112 position moves within the range of approximately 25° to 35° for proper operational control. With the appropriate setting in place for the bypass center pressure differential $\delta P_1$ 116, the pressure differentials $\delta P_2$ 142 and $\delta P_3$ 162 between the inner load and inner unload regions of the muffle and the chase ambient pressure are measured in step 209.

In step 210, the pressure difference between $\delta P_2$ 142 and $\delta P_3$ 162 is reduced to approximately 0.0010" $H_2O$ by adjusting any one, or a combination of the following: the orifice size in the load exhaust gas path 134 or the unload exhaust gas path 154, the load outer, center, or inner curtains, and the unload outer, center, or inner curtains. As shown in this illustrative embodiment, the adjusted gas flow path may include gas inlets such as the load and unload outer, center, or inner curtains, and is not limited to the exhaust paths.

$\delta P_1$, $\delta P_2$, and $\delta P_3$ are re-measured at step 212 and the prior steps may be repeated to obtain the desired pressure and flow balance for this process recipe condition. Finally, at step 214, the resulting $\delta P_2$ and $\delta P_3$ values are entered as setpoints for the second (load) and third (unload) valve controllers 130, 150 to maintain the pressure balance automatically by adjusting one of the load or unload exhaust valves (or inert gas curtains, in an alternative embodiment) through feedback control. The system is left to stabilize or started for process operation in step 216. The program is re-executed at step 202 for a new process condition.

EXPERIMENTAL

Various aspects of the system and method of the present invention have been tested as shown with reference to FIGS. 4 to 13. A number of experiments were conducted according the method and system of the present invention. These experiments are intended for illustration purposes only, and are not intended to limit the scope of the present invention in any way. FIGS. 4 to 8 show the results of a series of tests using different transducers. The 223B transducers are like those used in the prior art system disclosed in U.S. Pat. No. 6,143,080. The particular 223B sensors used for the new small pressure differential applications of the present invention have a dynamic pressure measurement range of approximately ±0.1" $H_2O$ (0.4 torr) rather than 0 to 2" $H_2O$ (approximately 0 to 4 Torr) with an accuracy of approximately ±0.001" $H_2O$ (±0.002 torr). In contrast, the 120A and 698A transducers are temperature controlled, vibration mounted sensors that have improved accuracy of approximately ±0.00005" $H_2O$ (±0.0001 torr). The 698A transducers have the added feature of a user-selectable response time between approximately 0.025 and 0.4 seconds. The 120A transducer was then modified to have the optimum response time of approximately 0.4 seconds for use in the system and method of the present invention.

EXAMPLE 1

Figure 4:
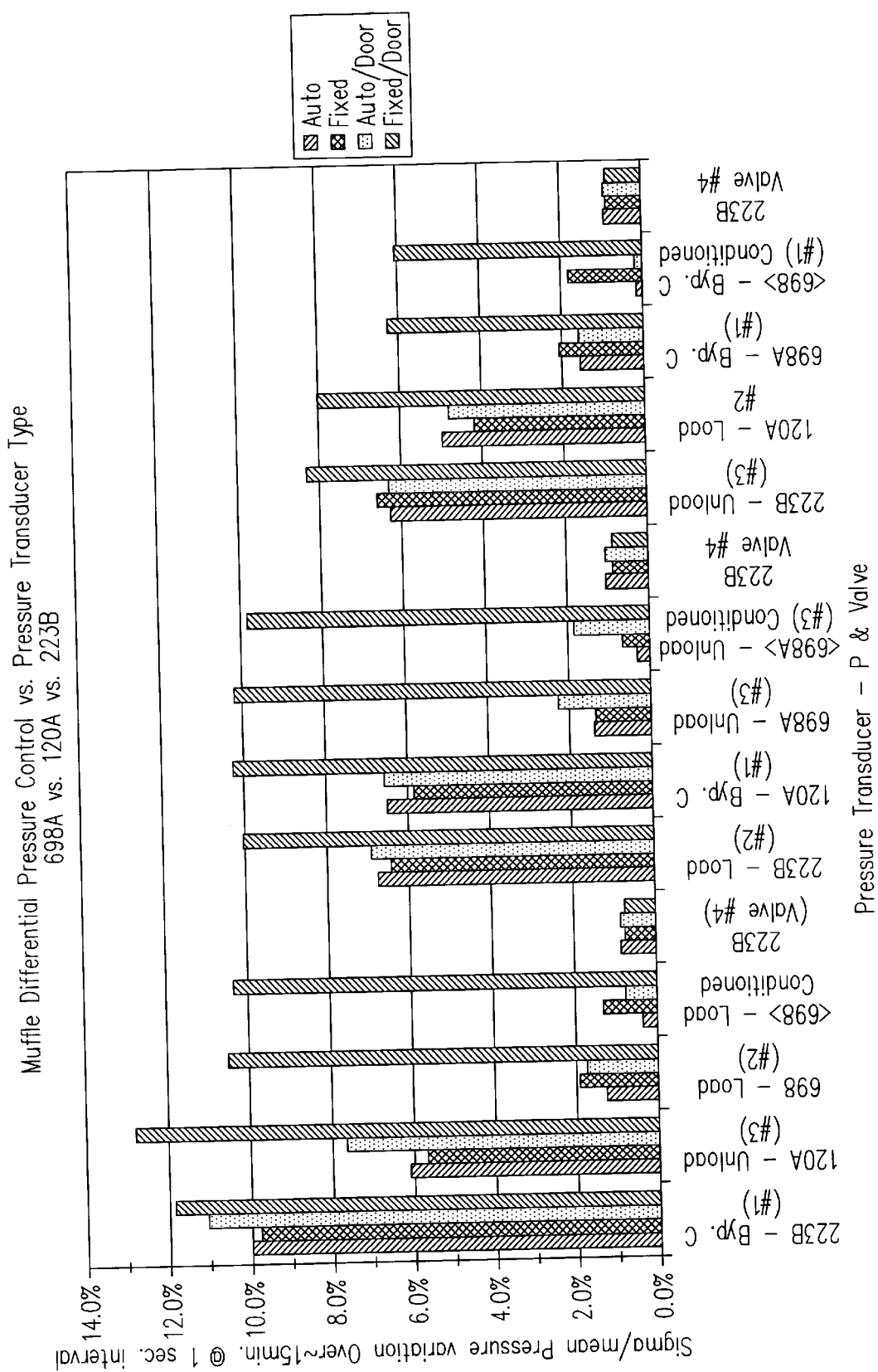
FIG. 4 is a graph illustrating the reduction in the perturbation in internal muffle pressure that occurs when the system is installed in a higher pressure clean room separated from the chase and the portal door is opened (as if to load or unload wafer cassettes), comparing prior art versus improved pressure sensing and control as provided by the present invention.

FIG. 4 is a chart illustrating relative muffle pressure perturbations occurring when one embodiment of the system of the present invention is installed in a clean room separated and held at a positive gauge pressure relative to the chase (ambient atmospheric) pressure. Four pressure transducer iterations were employed under various system conditions. The aforementioned three transducers: 223B, 120A, and 698A were used in addition to the 698A transducer employed in conjunction with a signal conditioner (Red Lion) that provides 3 second rolling averages of the 698A transducer output to smooth out measurement noise and stabilize the valve response. In this test, the 120A pressure transducer has a faster than optimum response time of 0.04 seconds, so the 698A transducer reflects the configuration of the present invention. As shown, a number of transducers were rotated between providing feedback to the first (bypass) valve 112, the third (unload) valve 152, the second (load) valve 132, and the fourth (bypass exhaust) throttle valve 180. For each configuration of the system, four 15 minute tests were run to determine pressure differential variability relative to the mean pressure differential between the muffle and ambient pressure. In the first, "Auto," test the system was operated as in the present invention—pressure transducer feedback is used to control the designated valve. The system is operated with no major perturbation events. In the second, "Fixed," test the automatic feedback control of the designated valve is disabled and the exhaust flow rate is fixed to simulate operation of the system as taught in the prior art. Again, no major system perturbations occurred during the 15 minute test. The "Auto/Door" and "Fixed/Door" tests correspond in system operation to the first two tests, respectively. However, in these final two tests, the portal door is opened (as if to load or unload wafer cassettes) during the 15 minute test period. As FIG. 4 shows, when the portal doors are unopened, the fixed and auto valve settings results in similar pressure perturbations in the muffle. However, opening of the portal door generated large pressure perturbations under fixed throttle valve conditions relative to the automatic feedback control mode of the present invention. The fixed case is similar to the prior art control method of maintaining a constant load and unload exhaust flow as described in U.S. Pat. 6,143,080. Operation of the CVD apparatus in accordance with the system and method of the present invention as shown by the performance associated with the 698A pressure transducer, substantially reduces the magnitude of pressure and flow fluctuations in the muffle.

EXAMPLE 2

Figure 5:
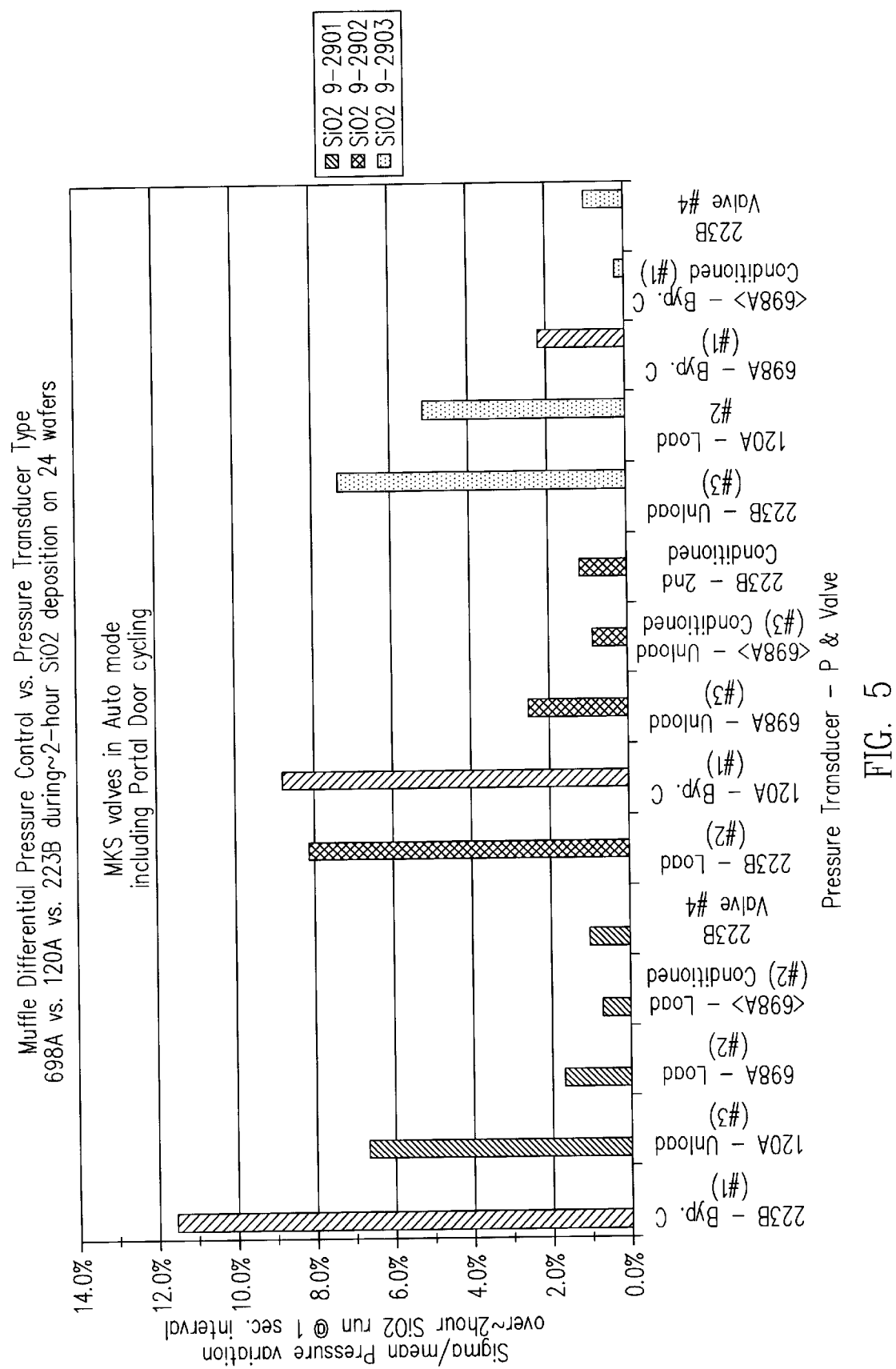
FIG. 5 is a graph showing the improvement in total pressure variation inside the muffle during the processing of wafers and including portal door opening according to the method and system of the present invention.

FIG. 5 is a chart showing relative muffle pressure perturbations for 2-hour $SiO_2$ deposition runs on 24 semiconductor wafers. An improvement in total pressure variation inside the muffle, during the processing of wafers and including portal door opening is shown, according to the present invention. Specifically, use of signal conditioned 698A transducer separately for the load, unload, or bypass center differential pressure measurement leads to substantially lowered relative pressure variations under the process condition of this experimental example. The unfiltered pressure variation from the use of the 698A transducer is also lowest, as the 120A transducer in this test still has the faster response time of 0.04 seconds. The greatest pressure variation is associated with the prior art type 223B transducer applied to the new method.

EXAMPLE 3

Figure 6:
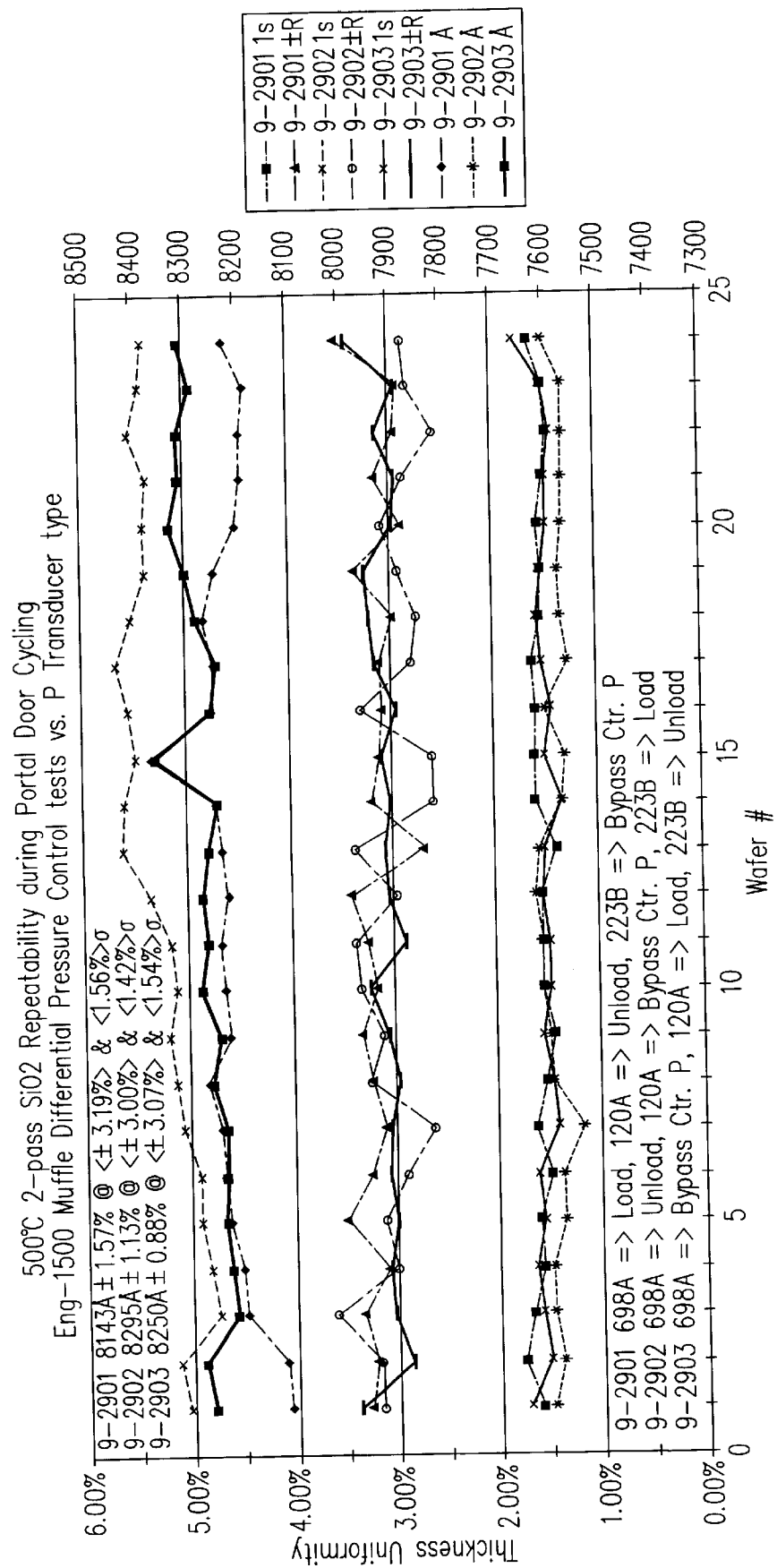
FIG. 6 is a graph showing the resulting on-wafer thickness uniformity performance for three different types of pressure transducers.

FIG. 6 shows experimental data illustrating the resulting on-wafer thickness uniformity performance for the three different types of pressure sensors according to the present invention. A series of 24 wafers were processed in each of three experimental cases in which one 689A transducer, one 120A transducer, and one 223B transducer as described above were rotated between the bypass center measurement and the load and unload region differential pressure measurements. Within wafer thickness uniformity (illustrated in the bottom two sets of three traces) did not vary much between the three process conditions (measured by both standard deviation as a percentage of the mean thickness and the range uniformity defined as ±(maximum−minimum)/(2× mean)). However, wafer to wafer thickness variability as quantified by (max−min)/(2×mean) for the average thickness of each wafer was smallest for the case in which the most sensitive sensor—the 698A—was installed to measure the bypass center region differential pressure to which the process results are the most sensitive.

EXAMPLE 4

Figure 7:
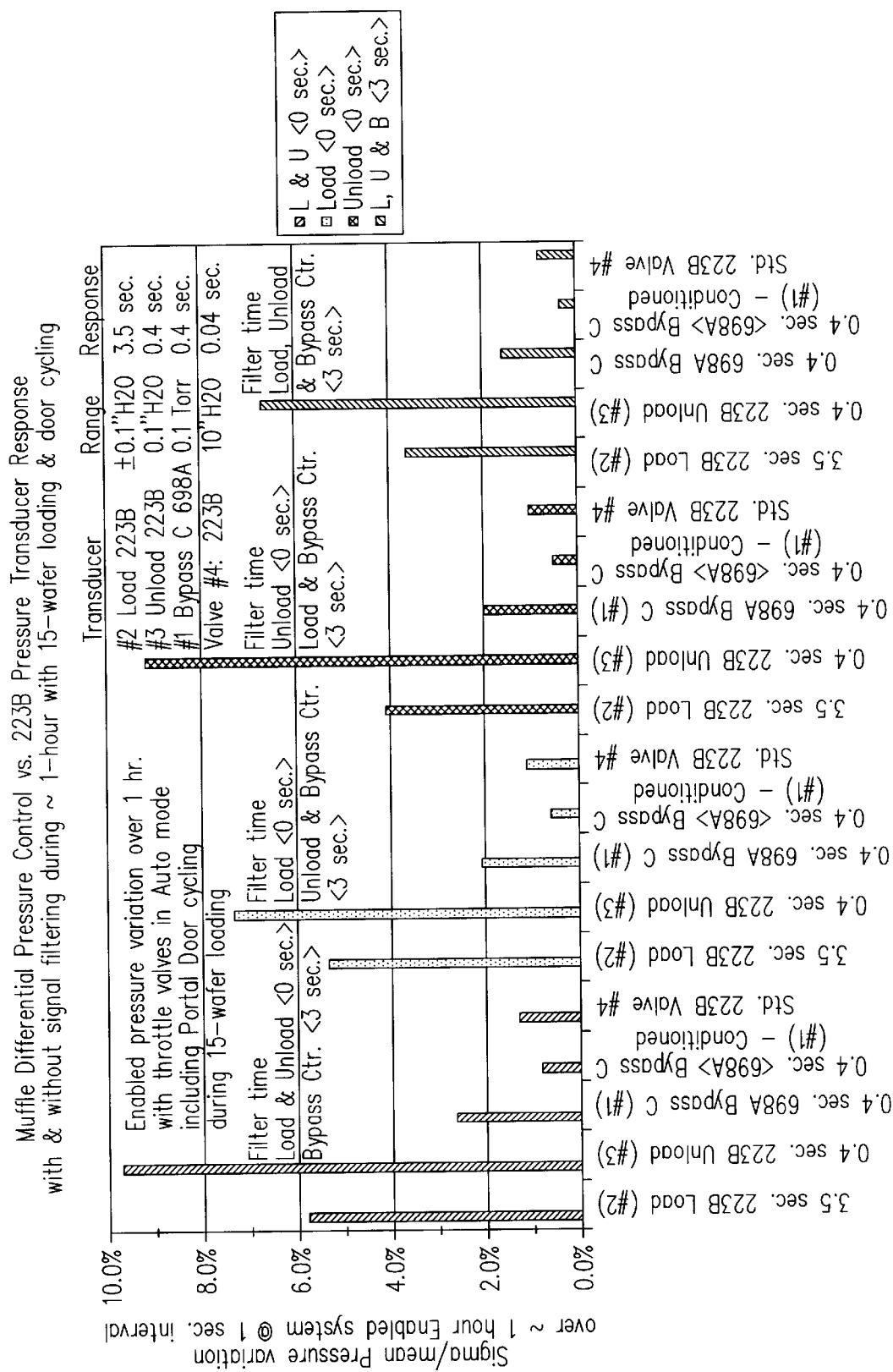
FIG. 7 is a graph illustrating the effect of filtering the feedback signal to a throttle valve on the resulting pressure stability inside the muffle due to the valve response, for four different types of pressure transducers.

The effect of filtering the feedback signal to the throttle valve and the resulting pressure stability inside the muffle due to the valve response is shown in FIG. 7. Use of 698A transducers having 0.4 second response time to provide feedback to the first valve controller 114 to control the first throttle valve 112 provided the smallest relative variations in muffle pressure. The pressure variations were further reduced by including the "Red Lion" signal conditioner 170 with an averaging time of approximately 3 seconds.

EXAMPLE 5

Figure 8:
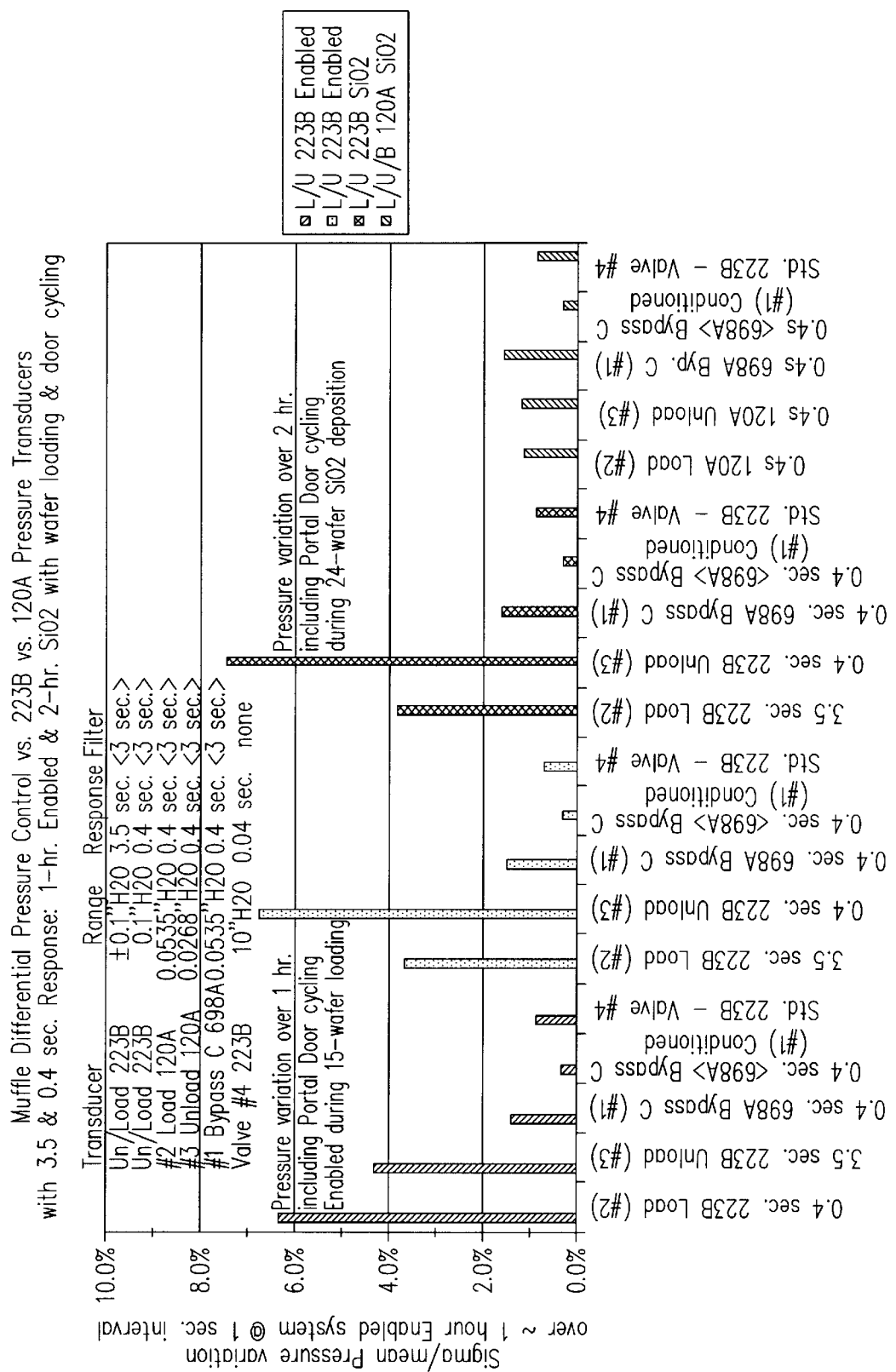
FIG. 8 is a graph showing the effect of the response time of a pressure transducer on the measured pressure stability inside the muffle, yielding the best stability according to one embodiment of the present invention where the new method of pressure control is applied to all three locations.

FIG. 8 shows the effect of the response time of the pressure sensor on the measured pressure stability inside the muffle. As in the previous examples, use of the 698A pressure transducer for the first throttle valve 112 and 120A pressure transducers modified to also have a response time of approximately 0.4 seconds for the second (load) and third (unload) valves 132, 152 substantially reduced the pressure variation in the muffle in all three locations over the experimental run of and two hours that included cycling of the portal doors and deposition processing of 24 wafers.

EXAMPLE 6

Figure 9A:
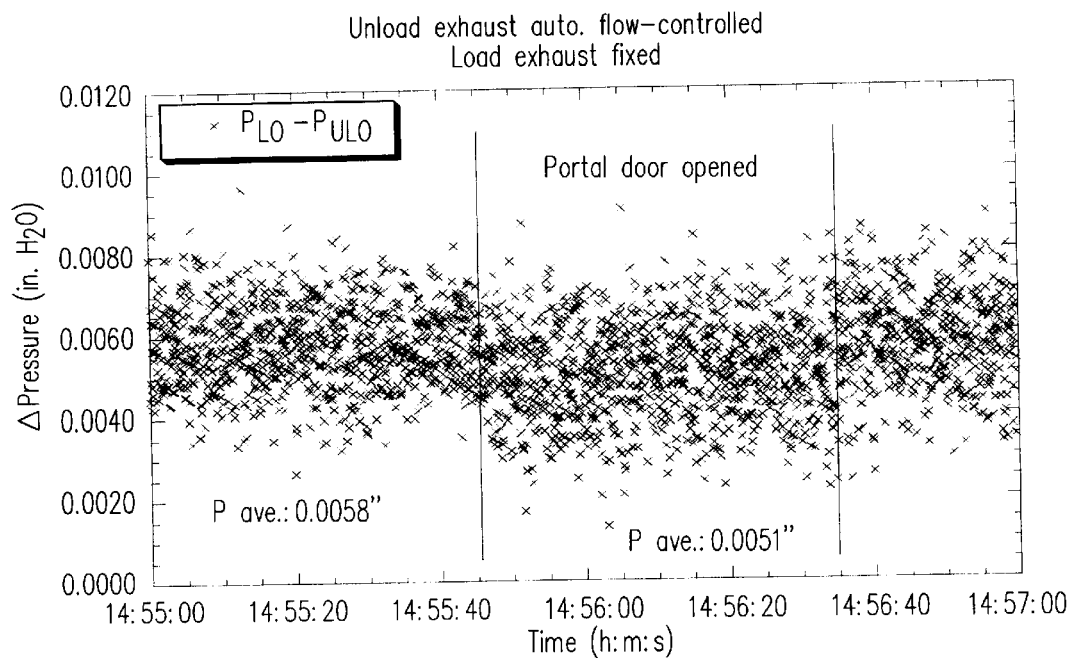
FIGS. 9A and 9B are graphs showing load-to-unload muffle differential pressure data with the load exhaust throttle valve in fixed position versus muffle differential pressure controlled mode, respectively, during opening of the portal door.
Figure 9B:
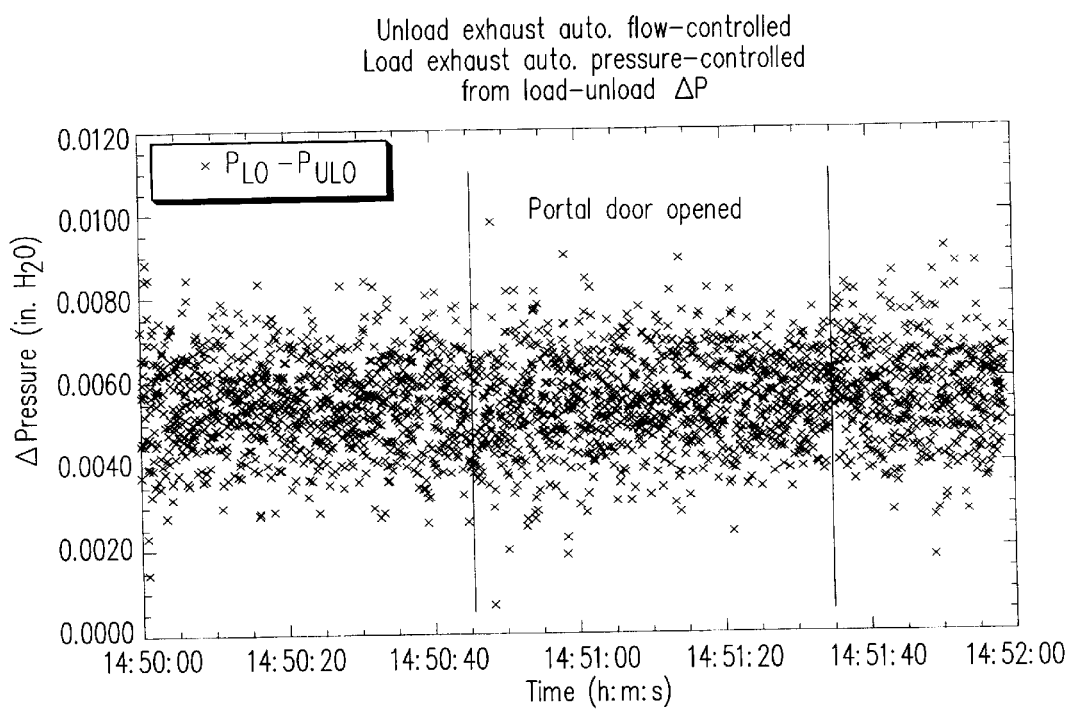

FIGS. 9A and 9B show experimental pressure differential data between the load 136 and unload 156 regions of the muffle 140 according to the present invention. FIG. 9A is a scatter plot of pressure differentials for a system operated to mimic a prior art system. The load exhaust rate is fixed with the unload exhaust automatically controlled to maintain constant flow. The data in FIG. 9B are from a similar test with the load exhaust controlled dynamically based on differential pressure transducer readings between the load and unload regions of the muffle. In each test, the portal door is opened for the indicated period of time. In FIG. 9A, the prior art system exhibits a shift in the pressure differential between the closed and open portal door position while the data shown in FIG. 9B corresponding to the present invention are substantially constant.

EXAMPLE 7

Figure 10A:
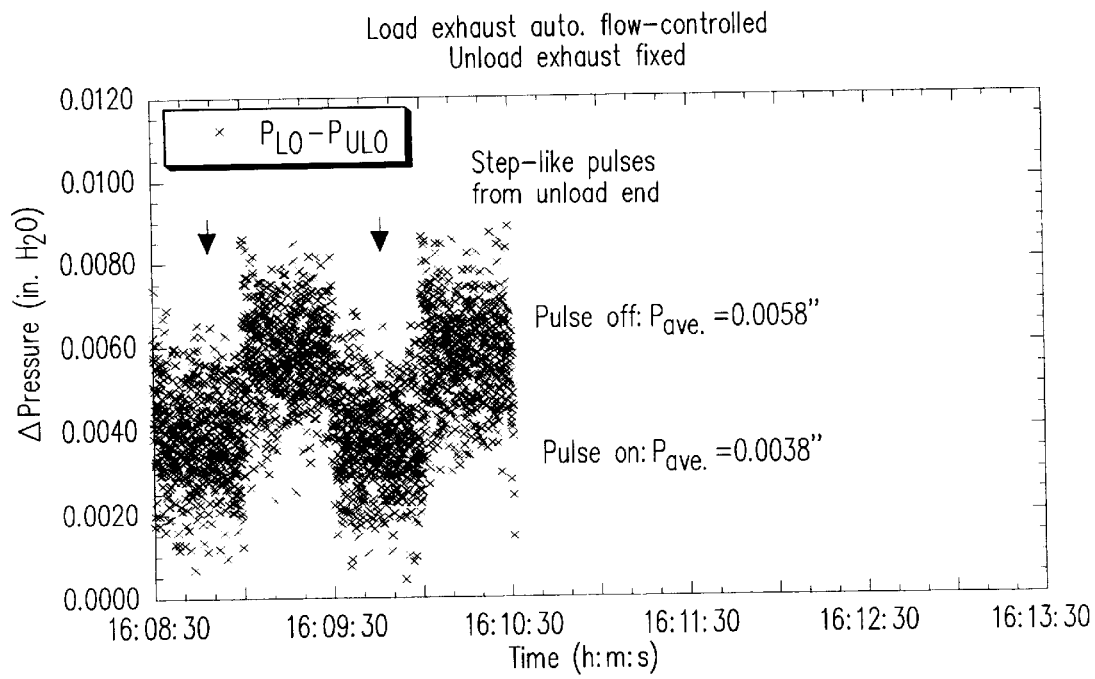
FIGS. 10A and 10B are graphs showing muffle differential pressure feedback control of the unload exhaust flow that eliminates shifts of 0.0020" $H_2O$ in the load-to-unload muffle differential pressure caused by step function external perturbation.
Figure 10B:
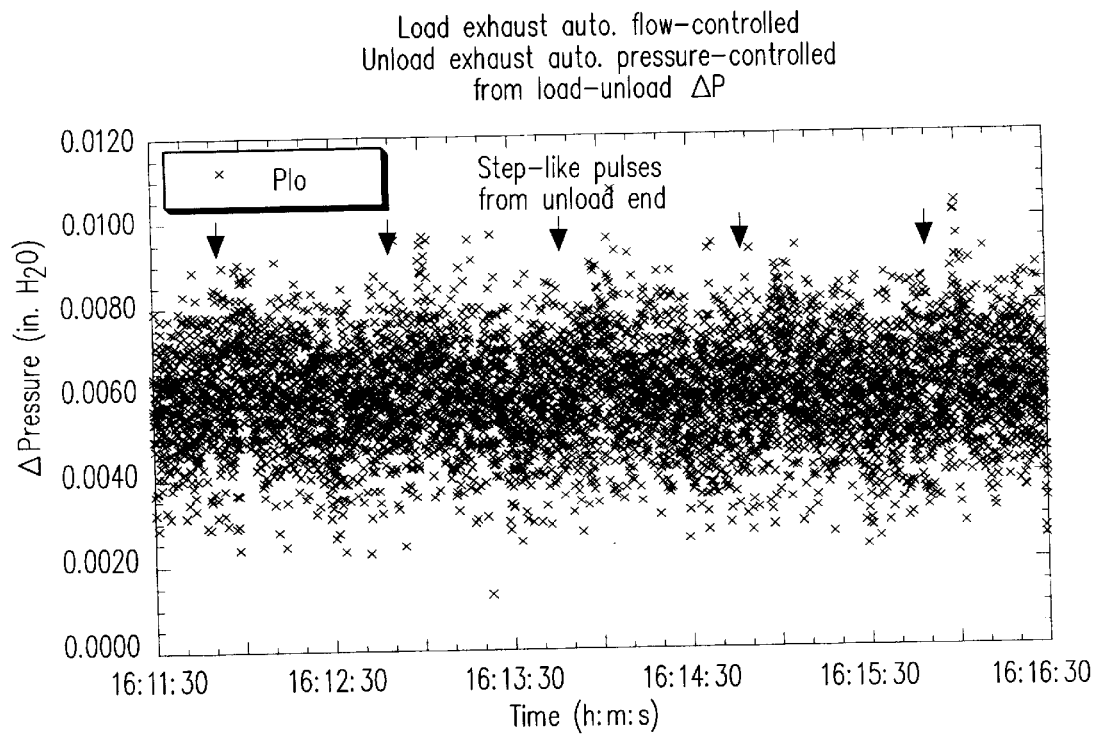

FIGS. 10A and 10B show data from tests similar to those described above in Example 6. A step function perturbation in the external room pressure at the unload end produced substantial variability (as much as 0.0020" $H_2O$) in the load-unload pressure differential in a system operated to mimic a prior art APCVD reactor (FIG. 10A). Automatic control of the unload region exhaust valve based upon the load to unload differential pressure feedback produces a much more stable and constant pressure profile in the muffle (FIG. 10B) according to the system and method of the present invention.

EXAMPLE 8

Figure 11A:
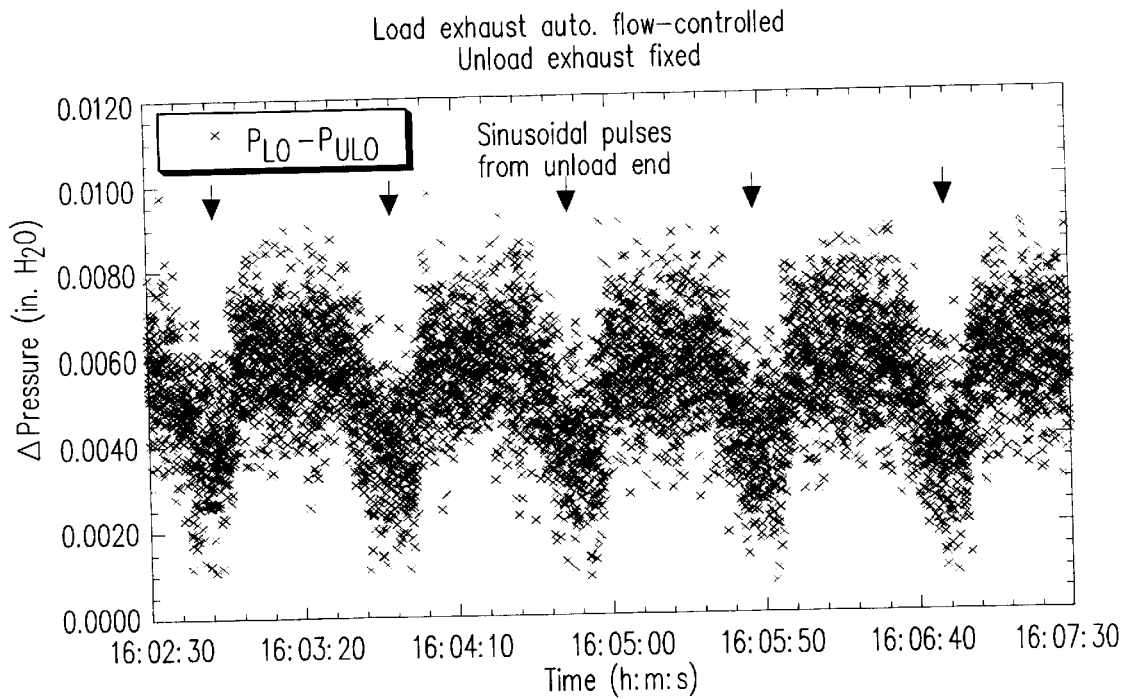
FIGS. 11A and 11B are graphs showing muffle differential pressure feedback control of the unload exhaust flow that eliminates shifts of 0.0020" $H_2O$ in the load-to-unload muffle differential pressure caused by sinusoidal external perturbation.
Figure 11B:
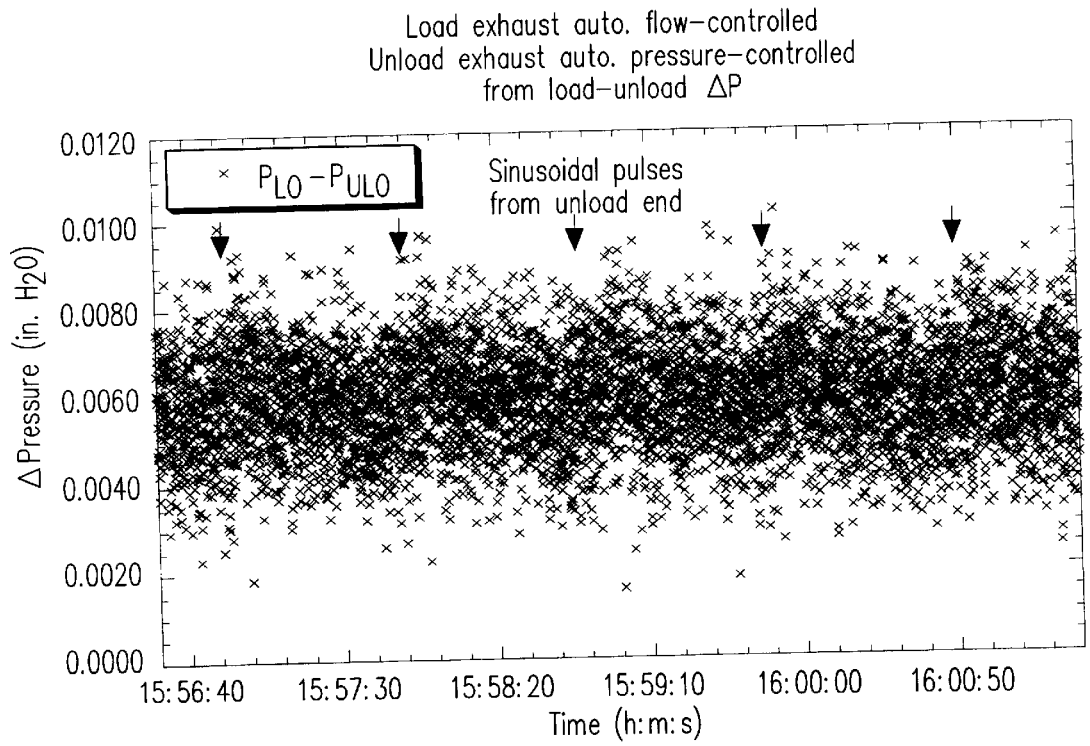

FIGS. 11A and 11B show data from tests similar to those described above in Example 7. Instead of a step function perturbation in the external pressure at the unload end of the muffle, a sinusoidally varying external pressure wave was provided. As with the step function perturbation discussed in Example 7, this produced a variation of about 0.0020" $H_2O$ as shown in FIG. 11A. As in the preceding examples, pressure transducer automatic control of the unload region exhaust valve based upon load to unload differential pressure feedback produces a much more stable and constant pressure profile in the muffle as shown in FIG. 11B.

EXAMPLE 9

Figure 12:
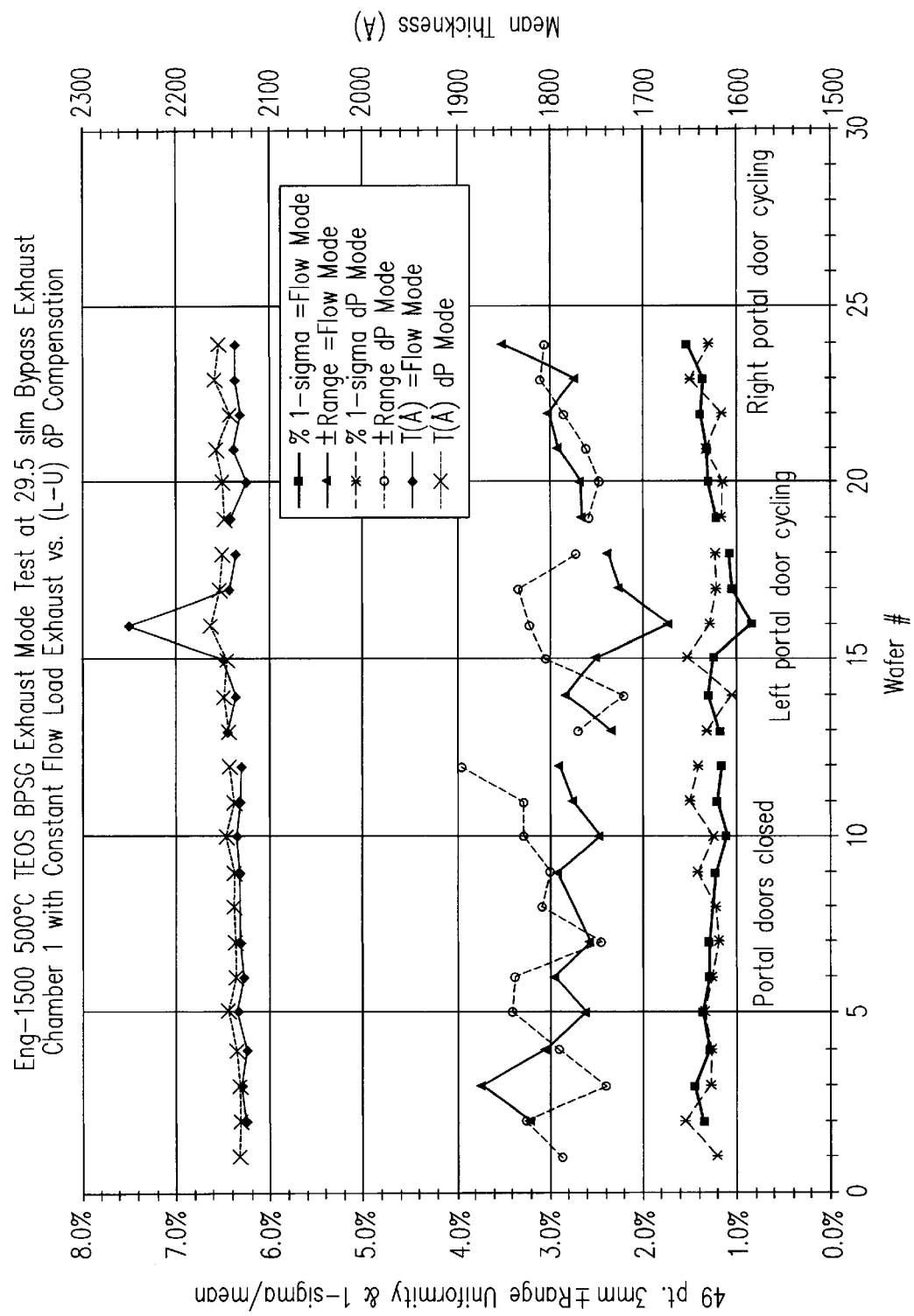
FIG. 12 is a graph showing on-wafer process results for constant flow control load exhaust versus load-to-unload muffle differential pressure feedback control.

FIG. 12 shows on-wafer process results comparison for prior art constant flow control load exhaust versus load-to-unload muffle differential pressure feedback control under conditions similar to the pressure measurements made in Example 6 (FIGS. 9A and 9B). The deposited film thickness and uniformity data are plotted similarly to the data in FIG. 6. The upper pair of lines show that the wafer-to-wafer thickness repeatability under pressure control according to the present invention is much better than with the prior art constant flow control method, especially upon opening of the left portal door as though to access wafer cassettes. The within-wafer thickness uniformity as plotted in the bottom two pairs of lines is not substantially different.

EXAMPLE 10

In a further experimental example, the system and method of the present invention were demonstrated for actual process deposition operation using a WJ-1500 Muffle provided by ASML and installed with the pressure control system of the present invention.

As illustrated in FIG. 1, process exhaust from 4 process chambers feeds through 8 chamber toroidal orifices into a 4" diameter chamber exhaust plenum. The chamber toroidal orifices are designed to equally divide the total flow so the entry and exit side of each chamber is exhausted at an equal flow rate regardless of how much deposition by-product powder accumulates. The bypass exhaust surrounding each chamber also feeds into the 4" diameter chamber exhaust plenum. The flow rate exiting the process muffle via the bypass exhaust is controlled to be constant by temperature-compensated correlation to the pressure drop across a selectable size in-line orifice. Preferably, only inert chamber curtain $N_2$, flange purge $N_2$, vent shield bypass $N_2$, and load and unload curtain $N_2$ should enter the bypass exhaust line, so no powder accumulation should impact the flow versus pressure correlation. Both the chamber process exhaust and the bypass exhaust flow together downstream, possibly through a powder trap, through the first throttle valve 112. The first throttle valve 112 adjusts to maintain a constant pressure differential between the internal process chamber section of the muffle and the ambient chase room, as measured by $\delta P_1$ (bypass center—chase). Thus, there is some automatic compensation for any shift in the input gas flow. If the gas cabinet $N_2$ pressure increases above 40 psig, as might happen if some other facility use of $N_2$ is shut off, then the increased flow through the rotameters to the $N_2$ shields, floor purge, flange purge and curtains will increase the pressure inside the muffle. $\delta P_1$ increases under these conditions, causing the first throttle valve 112 to open, thus increasing the exhaust and restoring the desired setpoint pressure. Normally, the first throttle valve 112 will slowly open over time as the process exhaust line becomes more resistive to flow as powder accumulates. Using a heated first throttle valve reduces the powder accumulation on the damper, thus reducing the angle increase over time as well as maintenance requirements for cleaning. The fifth throttle valve (bypass) tends to move opposite the first throttle valve, normally slowly closing over time as the chamber plenum pressure is increased since no powder accumulation restricts the flow through the bypass exhaust line. The pressure sensing lines to the bypass center muffle port and the chase room are not affected by powder accumulation, so there should be no reduction in process exhaust flow over the deposition runtime. Prior methods of process exhaust control relied upon the correlation of pressure drop to flow across a self-cleaning chamber or venturi toroidal orifice, but both were subject to geometry changes over time due to powder accumulation, glass deposition, and mechanical motion (causing wear and using imperfect seals).

The load and unload exhaust line tees into the process exhaust line downstream of the first throttle valve (process valve). The total flow through the load and unload exhaust line varies because the second and third (load and unload) throttle valves act to control the pressure in the load and unload sections of the process muffle. The second (load) throttle valve opens and closes to maintain a constant pressure differential between the internal load section of the muffle and the ambient chase room, as measured by the $\delta P_2$ (inner load—chase). Intrusion of higher clean room pressure upon opening either portal door and wafer loading cause the inner load pressure to vary, so this method of control compensates for those changes to better maintain a constant muffle pressure balance. The third (unload) throttle valve opens and closes to maintain a constant pressure differential between the internal unload section of the muffle and the ambient chase room, as measured by the $\delta P_3$ (inner unload—chase). Intrusion of higher clean room pressure upon opening either portal door and wafer loading also cause the inner unload pressure to vary, so this method of control compensates for those changes to better maintain a constant muffle pressure balance. Fast motor throttle valves are used for both the load and unload exhaust lines for rapid compensation of muffle pressure changes. Signal filtering or conditioning of the muffle differential pressures may be accomplished with a signal conditioner provided by Red Lion. Conditioning generates moving average values for the controllers so the valves can respond to small pressure changes without following noise.

The facility exhaust line pressure relative to the ambient chase room pressure is sensed downstream of where the load and unload exhaust line tees into the process exhaust line. The fourth throttle valve just downstream of the pressure sensing port adjusts to maintain a constant facility exhaust line pressure. The fourth throttle valve thus better isolates the WJ-1500 system exhaust from any facility scrubber or blower fluctuations, as might occur when exhaust from other systems is cycled on or off. The phase lead and gain values programmed on the fourth valve controller are adjusted for the specific exhaust line geometry to minimize the muffle ($\delta P_1$) and chamber plenum Pressure variation, as well as to respond quickly to perturbations.

Figure 13:
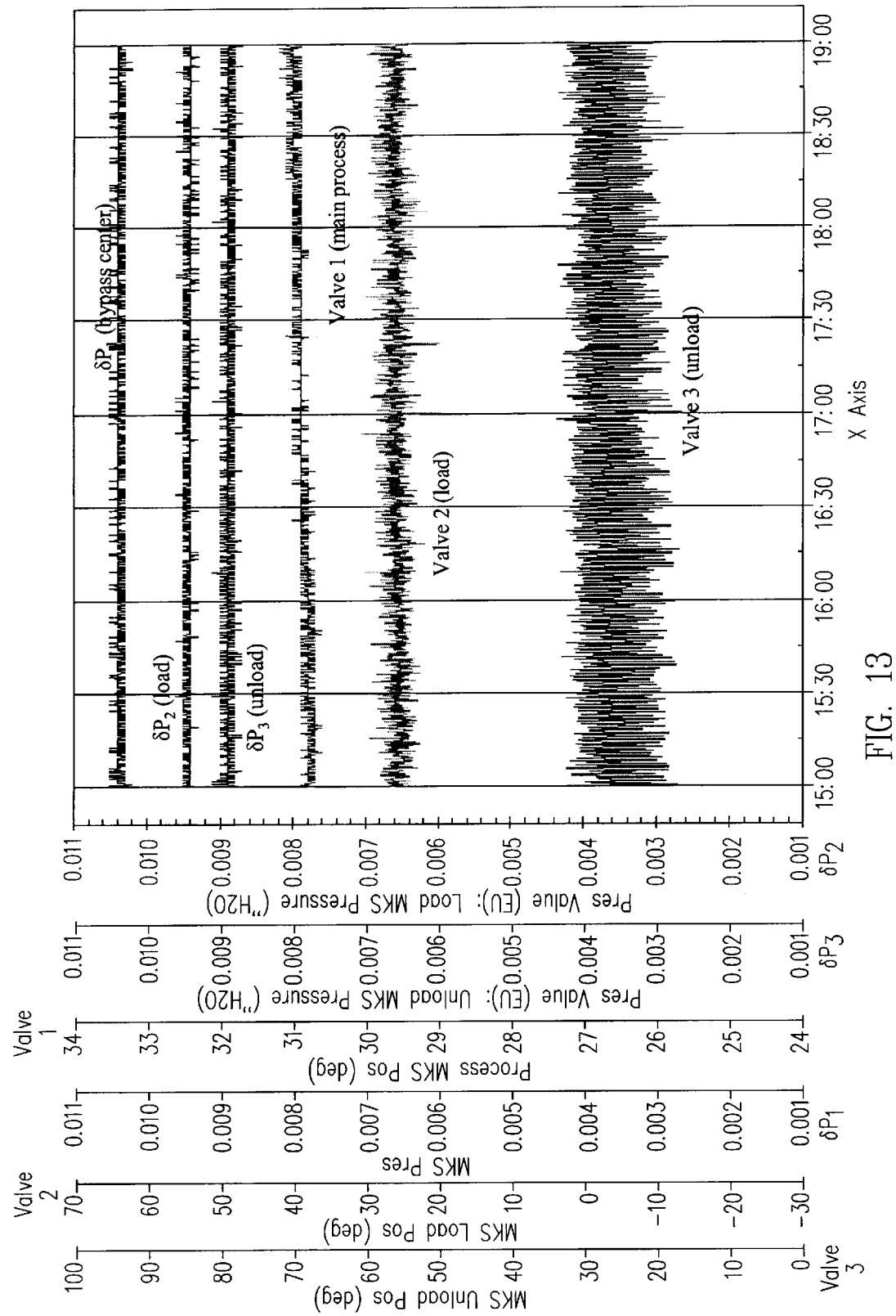
FIG. 13 is a plot of pressure and valve position data over a 4-hour period of continuous operation during borophosphoro-silicate glass (BPSG) film deposition in a full system according to the present invention, showing the stability of $\delta P_1$, $\delta P_2$, and $\delta P_3$ and the position of the first, second, and third throttle valves under the exhaust control method of the present invention.

A continuous deposition run of approximately 130 hours was completed in the system described above in which valve positions for the first, second, and third throttle valves and pressure transducer measurements in the bypass center, load, and unload regions were collected and logged every 6 seconds. On-wafer thickness metrics were also calculated for each of the semiconductor wafers processed during this time. The system ran continuously for approximately 120 hours before significant-degradation in the wafer film thickness uniformity was detected. FIG. 13 illustrates the ability of the exhaust control system and method of the present invention to regulate the muffle differential pressures over a four hour sample of the aforementioned 130 hour run. The first (bypass center, $\delta P_1$), second (load, $\delta P_2$), and third (unload, $\delta P_3$) muffle differential pressures relative to the chase ambient pressure are plotted after 3-second moving average signal processing occurred in the signal conditioner. The movement of the first (process), second (load), and third (unload) throttle valves to control those muffle differential pressures via the respective pressure transducer feedback signal responses is also plotted. The first throttle valve (process) opens slowly over time to maintain the approximately 0.0104" $H_2O$ pressure setpoint. The second (load) and third (unload) throttle valves cycle in position primarily in response to wafer loading effects.

Tables 1 and 2 list process operation statistics for the 4 hour run data shown in FIG. 13. Table 1 lists statistics for filtered data (data process by the signal conditioner via a 3-second moving average) and Table 2 lists raw statistics based on direct output from the pressure transducers collected at one-second intervals. Even without the data smoothing effects of the signal conditioner's moving averages, the overall variability in pressure differentials inside the system muffle is very low.

During the 4 hour segment of data shown in FIG. 13, the chamber pressure increased by only 0.1" $H_2O$, the first (process) throttle valve opened only an additional 0.60° in position, and the fifth (bypass exhaust) throttle valve closed only 0.5° in position. The variation in the muffle differential pressures being controlled is well under 1.0% σ/mean after the 3 second signal filtering, or about 2% σ/mean as directly measured by the unfiltered pressure transducer output. The chamber plenum pressure variation is about 1.0% σ/mean, while the average chamber pressure variation is less than 0.5% σ/mean, after signal filtering by taking the 100 second moving average. The second (load) and third (unload) exhaust throttle valves and orifice pressures vary much more due to the varying exhaust flow required to maintain the load and unload muffle differential pressures during wafer loading.

TABLE 1

Statistics for 4-hours of data at 6-second intervals presented in FIG. 13: 3-second averaged

| Item | Min | Mean | σ | Max | σ/Mean |
|---|---|---|---|---|---|
| Bypass Center Pressure $\delta P_1$, "$H_2O$ | 0.0102 | 0.01038 | 0.000056 | 0.0105 | 0.54% |
| Load region $\delta P_2$, "$H_2O$ | 0.0093 | 0.00943 | 0.000055 | 0.0096 | 0.58% |
| Unload region $\delta P_3$, "$H_2O$ | 0.0087 | 0.00888 | 0.000072 | 0.0091 | 0.81% |
| First throttle valve position, ° | 30.6 | 30.88 | 0.1001 | 31.2 | 0.32% |
| Second throttle valve (load) position, ° | 19.7 | 25.82 | 1.4490 | 30.6 | 5.6% |
| Third throttle valve (unload) position, ° | 16.5 | 26.43 | 3.8909 | 33.7 | 14.7% |
| Load orifice ΔP, "$H_2O$ | −1.208 | −0.725 | 0.1165 | −0.276 | 16.1% |
| Unload orifice ΔP, "$H_2O$ | −1.204 | −0.580 | 0.2927 | −0.074 | 50.4% |
| Bypass orifice ΔP, "$H_2O$ | −0.740 | −0.704 | 0.0101 | −0.672 | 1.44% |
| Fifth throttle valve (bypass) position, ° | 27.8 | 28.08 | 0.1026 | 28.3 | 0.37% |
| Bypass orifice temp., ° C. | 61 | 61.4 | 0.4964 | 62 | 0.81% |
| Load orifice temp., ° C. | 100 | 103.0 | 0.5574 | 104 | 0.54% |
| Unload orifice temp., ° C. | 56° C. | 57.5 | 0.6544 | 59 | 1.14% |
| Chamber pressure, "$H_2O$ | −1.492 | −1.447 | 0.0151 | −1.393 | 1.04% |
| Average chamber P, "$H_2O$ | −1.469 | −1.446 | 0.0102 | −1.427 | 0.70% |
| Etch pressure, "$H_2O$ | −1.279 | −1.258 | 0.0067 | −1.239 | 0.53% |

TABLE 2

Statistics for 4-hours of data presented in FIG. 13: Unfiltered

| Item | Mean | σ | σ/Mean |
|---|---|---|---|
| Bypass Center Pressure $\delta P_1$, " $H_2O$ | 0.0105 | 0.000185 | 1.77% |
| Load region $\delta P_2$, " $H_2O$ | 0.0096 | 0.000193 | 2.01% |
| Unload region $\delta P_3$, " $H_2O$ | 0.0091 | 0.000171 | 1.89% |
| Fourth Valve Pressure, " $H_2O$ | 4.010 | 0.04472 | 1.12% |

The foregoing description of specific embodiments and examples of the invention have been presented for the purpose of illustration and description, and although the invention has been illustrated by certain of the preceding examples, it is not to be construed as being limited thereby. They are not intended to be exhaustive or to limit the invention to the precise forms disclosed, and obviously many modifications, embodiments, and variations are possible in light of the above teaching. It is intended that the scope of the invention encompass the generic area as herein disclosed, and by the claims appended hereto and their equivalents.

What is claimed is:

1. A wafer processing system for delivering at least one gas to a wafer surface and removing one or more exhaust gases from said wafer surface, comprising:

an atmospheric pressure muffle;

one or more exhaust passages for exhausting gases from said muffle; and an exhaust control feedback system coupled to said muffle and said one or more exhaust passages, said feedback system having one or more sensors to measure one or more pressure differentials between at least one selected point within said muffle or said exhaust passages and the chase ambient pressure external to said wafer processing system and to adjust one or more control units to maintain one or more desired setpoint values for said pressure differentials within said wafer processing system.

2. The wafer processing system of claim 1 wherein said muffle includes a process chamber bypass center, a load, and an unload region, and said one or more sensors are a first, a second, and a third pressure transducer that measure the differential pressures inside said bypass center, load, and unload regions, respectively, relative to the chase ambient pressure.

3. The wafer processing system of claim 2 wherein said one or more control units comprise:
   a first throttle valve that meters exhaust flow from said process chamber bypass center region in response to feedback from said first pressure transducer;
   a second control unit selected from the group consisting of a throttle valve that meters exhaust flow from said process chamber load region and a flowmeter that meters the flow of one or more inert gases through one or more inert gas curtains into said load region, said control unit operating in response to feedback from said second pressure transducer; and
   a third control unit selected from the group consisting of a throttle valve that meters exhaust flow from said process chamber load region and a flowmeter that meters the flow of one or more inert gases through one or more inert gas curtains into said unload region, said control unit operating in response to dynamic feedback from said third pressure transducer.

4. The wafer processing system of claim 3 further comprising:
   a fourth pressure transducer that measures the pressure differential between the interior of a facility exhaust line and the chase ambient pressure, said facility exhaust line carrying combined exhaust gas flows from said bypass center, load, and unload regions of said muffle; and
   a fourth throttle valve that controls the rate of exhaust gas flow on said facility exhaust line in response to dynamic feedback from said fourth pressure transducer.

5. The wafer processing system of claim 3 further comprising:
   a bypass exhaust manifold for venting gas from said muffle;
   a fifth pressure transducer measuring the pressure drop across an inline orifice in a bypass exhaust line carrying exhaust gases from said bypass exhaust manifold; and
   a fifth throttle valve that controls the rate of exhaust gas flow from said bypass exhaust manifold in response to dynamic feedback from said fifth pressure transducer.

6. The wafer processing system of anyone of claim 3 wherein said first, second, and third pressure transducers measure differential pressures to within an absolute error of approximately 0.0001 torr.

7. The wafer processing system of claim 6 wherein said first, second, and third pressure transducers have an internal signal response time in the range of approximately 0.1 to 1.0 seconds.

8. The wafer processing system of claim 6 wherein said first, second, and third pressure transducers have an internal signal response time of approximately 0.4 seconds.

9. The wafer processing system of claim 6 further comprising:
   a signal conditioner that filters data collected by one or more of said pressure transducers before said data is provided as dynamic feedback to one or more of said control units and throttle valves.

10. The wafer processing system of claim 9 wherein said signal conditioner averages data from said one or more pressure transducers over a preset period of time to reduce the impact of measurement noise.

11. The wafer processing system of claim 10 wherein said preset period of time is in the range of approximately 1 to 10 seconds.

12. The wafer processing system of claim 10 wherein said preset period of time is approximately 3 seconds.

13. A chemical vapor deposition processing system for delivering one or more reactive gases and one or more inert gases to process a wafer or other substrate, comprising:
   a muffle, said muffle being maintained at approximately atmospheric pressure and containing at least one process chamber housing at least one injector through which said one or more reactive gases are injected and at least one shield or curtain through which said one or more inert gases are injected into a deposition region and at least one exhaust vent through which reactive gases and inert gases are removed;
   a load region through which wafers are inserted into said muffle;
   an unload region through which wafers are removed from said muffle;
   a process chamber exhaust flow path through which all of said reactive gases and at least a fraction of said one or more inert gases removed from said muffle are exhausted;
   at least a first pressure transducer, said first pressure transducer measuring the pressure difference between said muffle in the process chamber region and the ambient atmospheric pressure and providing a feedback control signal in response to said pressure difference; and
   a first control unit comprising a first throttle valve, said throttle valve controllable in response to said feedback control signal, said throttle valve metering the flow of gases that are exhausted from said process chamber exhaust flow path of said CVD system.

14. The wafer processing system of claim 13 further comprising:
   a second pressure transducer that measures the differential pressure inside said load region relative to the ambient atmospheric pressure; and
   a third pressure transducer that measures the differential pressures inside said unload region relative to the ambient atmospheric pressure.

15. The wafer processing system of claim 14 further comprising:
   a second control unit selected from the group consisting of a throttle valve that meters exhaust flow from said process chamber load region and a flowmeter that meters the flow of one or more inert gases through one or more inert gas curtains into said load region, said control unit operating in response to feedback from said second pressure transducer; and
   a third control unit selected from the group consisting of a throttle valve that meters exhaust flow from said process chamber load region and a flowmeter that meters the flow of one or more inert gases through one or more inert gas curtains into said unload region, said control unit operating in response to feedback from said third pressure transducer.

16. The wafer processing system of claim 15 further comprising:
   a fourth pressure transducer that measures the pressure differential between the interior of a facility exhaust line and the chase ambient pressure, said facility exhaust line carrying combined exhaust gas flows from said process chamber, load, and unload regions of said muffle; and a fourth control unit comprising a fourth throttle valve that controls the rate of exhaust gas flow on a facility exhaust line in response to dynamic feedback from said fourth pressure transducer.

17. The wafer processing system of claim 16 further comprising:
a bypass exhaust manifold for venting gas from said muffle;
a fifth pressure transducer that measures the pressure drop across an inline orifice in a bypass exhaust line carrying exhaust gases from said bypass exhaust manifold; and
a fifth control unit comprising a fifth throttle valve that controls the rate of exhaust gas flow from said bypass exhaust manifold in response to dynamic feedback received from said fifth pressure transducer.

18. The wafer processing system of any one of claim 15 wherein said first, second, and third pressure transducers measure differential pressures to within an absolute error of approximately 0.0001 torr.

19. The wafer processing system of claim 18 wherein said first, second, and third pressure transducers have an internal signal response time in the range of approximately 0.1 to 1.0 seconds.

20. The wafer processing system of claim 18 wherein said first, second, and third pressure transducers have an internal signal response time of approximately 0.4 seconds.

21. The wafer processing system of claim 18 further comprising:
a signal conditioner that filters data collected by one or more of said pressure transducers before passing said data to one or more of said respective control units.

22. The wafer processing system of claim 21 wherein said signal conditioner averages data from said one or more pressure transducers over a preset period of time to reduce the impact of measurement noise.

23. The wafer processing system of claim 21 wherein said preset period of time is in the range of approximately 1 to 10 seconds.

24. The wafer processing system of claim 21 wherein said preset period of time is approximately 3 seconds.

25. A method of delivering and exhausting one or more gases in an atmospheric pressure wafer processing system that comprises a muffle with at least one process chamber for chemical vapor deposition while maintaining an approximately constant pressure that is close to atmospheric throughout said system comprising the steps of:
temporarily fixing the positions of each of two throttle valves controlling exhaust gas flow from a load and unload region of said system;
measuring the pressure in a chamber exhaust plenum of said system and adjusting a first pressure differential setpoint, $\delta P_1$, between said process chamber region and an ambient chase room pressure to establish a desired pressure in said chamber exhaust plenum for sufficient exhaust of process chemicals;
regulating gas flow through a main process exhaust line to maintain $\delta P_1$ at a constant preset value by controlling a first throttle valve on said main exhaust line;
determining the position of said first throttle valve and controlling the flow through a fourth throttle valve controlling a total system exhaust rate to permit operation of said first throttle valve within an optimum range of positions and to isolate said system from potential perturbations in downstream vacuum;
measuring the differential pressures, $\delta P_2$ and $\delta P_3$, respectively, between said load and said unload regions and said ambient chase room pressure;
obtaining a pressure difference between $\delta P_2$ and $\delta P_3$ in the range of approximately less than 0.002 torr by adjusting one or more gas flows in said load and unload regions;
entering $\delta P_2$ and $\delta P_3$ as setpoints for one or more valve controllers controlling said load and unload region throttle valves and returning said load and unload valves to automatic operation; and
allowing said system to stabilize before beginning process operation.

26. A chemical vapor deposition processing system for delivering one or more reactive gases and one or more inert gases to process a wafer or other substrate, comprising:
a muffle, said muffle being maintained at approximately atmospheric pressure and containing at least one process chamber housing at least one injector through which said one or more reactive gases are injected and at least one shield or curtain through which said one or more inert gases are injected into a deposition region and at least one exhaust vent through which reactive gases and inert gases are removed;
a load region through which wafers are inserted into said muffle;
an unload region through which wafers are removed from said muffle;
a process chamber exhaust flow path through which all of said reactive gases and at least a fraction of said one or more inert gases removed from said muffle are exhausted;
a bypass exhaust manifold for venting gas from said muffle;
a first pressure transducer, said first pressure transducer measuring the pressure difference between said muffle in the process chamber region and the ambient atmospheric pressure and providing a feedback control signal in response to said pressure difference;
a second pressure transducer that measures the differential pressure inside said load region relative to the ambient atmospheric pressure;
a third pressure transducer that measures the differential pressures inside said unload region relative to the ambient atmospheric pressure;
a fourth pressure transducer that measures the pressure differential between the interior of a facility exhaust line and the chase ambient pressure, said facility exhaust line carrying combined exhaust gas flows from said process chamber, load, and unload regions of said muffle;
a fifth pressure transducer that measures the pressure drop across an inline orifice in a bypass exhaust line carrying exhaust gases from said bypass exhaust manifold;
a first control unit comprising a first throttle valve, said throttle valve controllable in response to said feedback control signal, said throttle valve metering the flow of gases that are exhausted from said process chamber exhaust flow path of said CVD system;
a second control unit selected from the group consisting of a throttle valve that meters exhaust flow from said process chamber load region and a flowmeter that meters the flow of one or more inert gases through one or more inert gas curtains into said load region, said control unit operating in response to feedback from said second pressure transducer; and
a third control unit selected from the group consisting of a throttle valve that meters exhaust flow from said process chamber load region and a flowmeter that meters the flow of one or more inert gases through one or more inert gas curtains into said unload region, said control unit operating in response to feedback from said third pressure transducer. a fourth control unit comprising a fourth throttle valve that controls the rate of exhaust gas flow on a facility exhaust line in response to dynamic feedback from said fourth pressure transducer.

a fifth control unit comprising a fifth throttle valve that controls the rate of exhaust gas flow from said bypass exhaust manifold in response to dynamic feedback received from said fifth pressure transducer.

27. The wafer processing system of claim 26 wherein said first, second, and third pressure transducers measure differential pressures to within an absolute error of approximately 0.0001 torr.

28. The wafer processing system of claim 26 wherein said first, second, and third pressure transducers have an internal signal response time in the range of approximately 0.1 to 1.0 seconds.

29. The wafer processing system of claim 26 wherein said first, second, and third pressure transducers have an internal signal response time of approximately 0.4 seconds.

30. The wafer processing system of claim 26 further comprising:

a signal conditioner that filters data collected by one or more of said pressure transducers before passing said data to one or more of said respective control units by averaging data from said one or more pressure transducers over a preset period of time to reduce the impact of measurement noise.

31. The wafer processing system of claim 30 wherein said preset period of time is in the range of approximately 1 to 10 seconds.

32. The wafer processing system of claim 30 wherein said preset period of is approximately 3 seconds.

* * * * *